(12) United States Patent
Shibuya

(10) Patent No.: US 9,815,698 B2
(45) Date of Patent: Nov. 14, 2017

(54) METHOD OF MANUFACTURING CARBON NANOTUBES

(71) Applicant: ZEON CORPORATION, Chiyoda-ku, Tokyo (JP)

(72) Inventor: Akiyoshi Shibuya, Tokyo (JP)

(73) Assignee: ZEON CORPORATION, Chiyoda-ku, Tokyo (JP)

( * ) Notice: Subject to any disclaimer, the term of this patent is extended or adjusted under 35 U.S.C. 154(b) by 0 days.

(21) Appl. No.: 14/652,215

(22) PCT Filed: Dec. 18, 2013

(86) PCT No.: PCT/JP2013/007442
§ 371 (c)(1),
(2) Date: Jun. 15, 2015

(87) PCT Pub. No.: WO2014/097624
PCT Pub. Date: Jun. 26, 2014

(65) Prior Publication Data
US 2015/0321917 A1    Nov. 12, 2015

(30) Foreign Application Priority Data

Dec. 20, 2012 (JP) ................................ 2012-278685

(51) Int. Cl.
*C23C 16/00* (2006.01)
*C01B 31/02* (2006.01)
(Continued)

(52) U.S. Cl.
CPC ........ *C01B 31/0226* (2013.01); *C01B 32/162* (2017.08); *C23C 16/52* (2013.01); *B82Y 40/00* (2013.01)

(58) Field of Classification Search
CPC .......... C23C 16/52; B82Y 30/00; B82Y 40/00
See application file for complete search history.

(56) References Cited

U.S. PATENT DOCUMENTS

2010/0062229 A1   3/2010  Hata et al.
2011/0308462 A1*  12/2011  Shibuya ................. B01J 15/005
                                                          118/724

FOREIGN PATENT DOCUMENTS

EP    2383225 A1   11/2011
EP    2397440 A1   12/2011
(Continued)

OTHER PUBLICATIONS

Kenji Hata et. al., "Water-Assisted Highly Efficient Synthesis of Impurity-Free Single-Walled Carbon Nanotubes", Science, Nov. 19, 2004, vol. 306, pp. 1362-1364.
(Continued)

*Primary Examiner* — Kelly M Gambetta
(74) *Attorney, Agent, or Firm* — Kenja IP Law PC

(57) ABSTRACT

This method improves a carbon nanotube growth environment. In this method of manufacturing carbon nanotubes, the supply amount of catalyst activating material supplied in a carbon nanotube growing step is adjusted to the supply amount of catalyst activating material supplied at the time of maximum concentration of a gas component among multiple measurements made in the growing step, the gas component being at least one selected from the group consisting of hydrogen, methane, and ethane.

4 Claims, 8 Drawing Sheets

(51) Int. Cl.
C23C 16/52 (2006.01)
C01B 32/162 (2017.01)
B82Y 40/00 (2011.01)

(56) References Cited

FOREIGN PATENT DOCUMENTS

| | | | |
|---|---|---|---|
| JP | 2011173745 A | 9/2011 |
| JP | 2011219316 A | 11/2011 |
| JP | 2011-241104 A | 12/2011 |
| WO | 2010/076885 A1 | 7/2010 |
| WO | 2010/092787 A1 | 8/2010 |
| WO | WO 2010092787 A1 * | 8/2010 |

OTHER PUBLICATIONS

Aug. 8, 2016, the Extended European Search Report issued by the European Patent Office in the corresponding European Patent Application No. 13865515.4.
Jun. 23, 2015 International Preliminary Report on Patentability issued in International Patent Application No. PCT/J132013/007442.

* cited by examiner

METHOD OF MANUFACTURING CARBON NANOTUBES

TECHNICAL FIELD

This disclosure relates to a method of manufacturing carbon nanotubes.

BACKGROUND

A variety of techniques related to manufacturing of carbon nanotubes (hereinafter referred to also as "CNTs") have been reported.

Within a method of manufacturing CNTs using a CVD method, Kenji Hata et. al., "Water-Assisted Highly Efficient Synthesis of Impurity-Free Single-Walled Carbon Nanotubes", SCIENCE, Nov. 19, 2004, VOL. 306, pp. 1362-1364 (NPL 1) disclose a technique for dramatically increasing the activity and lifetime of a catalyst by placing the catalyst in contact with a catalyst activating material, such as water, along with source gas.

WO 2010/092787 (US 2011/0308462 A1) (PTL 1) discloses a manufacturing apparatus that manufactures CNTs, in which an apparatus component that is exposed to a reducing gas or a source gas is plated with molten aluminum so as to decrease the quantity of carbon contaminants that adhere to the apparatus component.

Furthermore, WO 2010/076885 (EP 2 383 225 A1) (PTL 2) discloses manufacturing CNTs efficiently by adjusting the ratio between the number concentration of carbon atoms in the source gas and the number concentration of oxygen atoms contained in the catalyst activating material.

JP 2011-241104 A (PTL 3) discloses manufacturing high-quality CNTs by controlling the flow rate of hydrocarbon gas, based on the results of analyzing a gas component in the catalyst activation zone, the synthesis zone, and the cooling zone, to set the hydrogen gas concentration in the catalyst activation zone to be 80% or more.

CITATION LIST

Patent Literature

PTL 1: WO 2010/092787 (US 2011/0308462 A1)
PTL 2: WO 2010/076885 (EP 2 383 225 A1)
PTL 3: JP 2011-241104 A

Non-Patent Literature

NPL 1: Kenji Hata et. al., "Water-Assisted Highly Efficient Synthesis of Impurity-Free Single-Walled Carbon Nanotubes", SCIENCE, Nov. 19, 2004, VOL. 306, pp. 1362-1364

During manufacturing of CNTs by the CVD method, the activity and lifetime of the catalyst are dramatically increased by bringing the catalyst into contact with a catalyst activating material such as water. With this method, catalyst activity is not lost even in an environment of high carbon concentration, and the manufacturing efficiency of CNTs increases dramatically.

Upon manufacturing CNTs in an environment of high carbon concentration, however, carbonaceous by-products other than CNTs (hereinafter also referred to as "carbon contaminants"), such as amorphous carbon, graphite, and the like adhere in large quantities to the inner wall surface of the furnace. Corrosion, such as permeation of carbon (carburizing) into the furnace wall, also progresses. Due to the adhesion of large quantities of carbon contaminants or to the progression of furnace material corrosion, the gas composition around the substrate that supports the catalyst ends up deviating from optimal conditions for CNT growth, leading to the problems of a reduction in the amount of CNTs manufactured and a deterioration of CNT quality.

It could therefore be helpful to provide a method of improving the CNT growth environment to efficiently manufacture high-quality CNTs.

SUMMARY

After carefully investigating how to solve the above problems, I have inferred that the above problems occur due to the following two reasons.
1: Carbon contaminants and the catalyst activating material trigger a chemical reaction by which CO or $CO_2$ is produced, thereby changing the gas composition.
2: Due to carbon contaminants or furnace material corrosion, thermal conductivity on the furnace wall surface or in the furnace changes, and the amount of cracking of the source gas changes.

I then discovered a correlation between the yield of carbon nanotubes and the concentration of hydrogen, methane, or ethane around the substrate for growing the carbon nanotubes. I also discovered that by monitoring the concentration of a gas component around the substrate during CNT growth and performing feedback control on the supply amount of catalyst activating material based on the monitored concentration, the CNT growth environment around the substrate can be maintained as an optimal environment, thus bringing my method to completion.

My method of manufacturing carbon nanotubes is a method of manufacturing carbon nanotubes by growing carbon nanotubes on a substrate that supports a catalyst on a surface thereof, including: growing carbon nanotubes on the substrate by supplying a carbon nanotube source gas and a catalyst activating material to the catalyst and heating at least one of the catalyst and the source gas; and performing feedback control by making a plurality of measurements of a concentration of a gas component around the substrate during the growing; extracting a supply amount of the catalyst activating material supplied at a time of maximum concentration of the gas component among the plurality of measurements, the gas component being at least one selected from the group consisting of hydrogen, methane, and ethane; and adjusting a supply amount of the catalyst activating material supplied in the growing to the extracted supply amount.

According to the above configuration, the concentration of a gas component around the substrate for growing carbon nanotubes during the growing is measured in advance a plurality of times. From among the plurality of measured values of the gas component concentration, the measured value yielding the maximum concentration of at least one gas selected from the group consisting of hydrogen, methane, and ethane is selected.

Next, the supply amount of catalyst activating material supplied when obtaining the gas component concentration of the selected measured value is extracted. The supply amount of the catalyst activating material supplied in the growing is then adjusted to match the extracted supply amount. In this way, the gas component concentration around the substrate can be maintained so that the concentration of at least one gas component selected from the group consisting of hydrogen, methane, and ethane is maximized.

The concentrations of hydrogen, methane, and ethane around the substrate correlate with the carbon nanotube yield. Therefore, by controlling the supply amount of the catalyst activating material so that the concentration of at least one gas component selected from the group consisting of hydrogen, methane, and ethane is maximized, it becomes possible to maintain the carbon nanotube growth environment around the substrate as an optimal environment. As a result, the adhesion of carbon contaminants can be prevented, and high-quality carbon nanotubes can be manufactured efficiently.

In my method of manufacturing carbon nanotubes, the performing feedback control preferably includes extracting the supply amount of the catalyst activating material supplied at a time of maximum concentration of hydrogen among the plurality of measurements of the concentration of the gas component.

According to the above configuration, in the performing feedback control, feedback control is performed on the supply amount of catalyst activating material based on the concentration of hydrogen, of which a relatively larger amount is detected around the substrate. Therefore, detection error is reduced, and the carbon nanotube growth environment can more reliably be optimized.

In my method of manufacturing carbon nanotubes, the gas component around the substrate preferably includes ethylene.

Carbon nanotubes can thus be manufactured efficiently.

My method of manufacturing carbon nanotubes preferably includes setting, before the growing, a heating temperature to which at least one of the catalyst and the source gas is heated in the growing, such that the setting includes: supplying a carbon nanotube source gas and a catalyst activating material around a position at which the substrate is housed and heating the source gas; measuring a concentration of a gas component around the position at which the substrate is housed; and setting the heating temperature so that the measured concentration of the gas component matches a concentration at a time of growing desired carbon nanotubes, the gas component being at least one selected from the group consisting of hydrogen, methane, and ethane.

According to this configuration, in the setting, before the growing, the heating temperature to which at least one of the catalyst and the source gas is heated in the growing is set. In the setting, first, the carbon nanotube source gas and catalyst activating material are supplied around the position at which the substrate is housed in the growing, and the supplied source gas is heated and pyrolyzed. The concentration of a gas component around the position at which the substrate is housed is then measured.

The concentration of a gas component around the position at which the substrate is housed correlates with the temperature around the position at which the substrate is housed. The temperature around the position at which the substrate is housed at the time of growing desired carbon nanotubes can be measured in advance. Therefore, based on this temperature, information on the concentration of a gas component around the position at which the substrate is housed at the time of growing desired carbon nanotubes can be obtained. The heating temperature for heating at least one of the catalyst and the source gas is then set so that the measured concentration of the gas component matches the concentration for growing desired carbon nanotubes, the gas component being at least one selected from the group consisting of hydrogen, methane, and ethane.

In this way, the environment around the substrate for growing carbon nanotubes can be set to an environment that yields desired carbon nanotubes.

Furthermore, the heating temperature for heating at least one of the catalyst and the source gas can be set based on the measured gas component concentration. Therefore, the temperature around the position at which the substrate is housed can be controlled accurately without directly measuring the temperature around the position at which the substrate is housed.

The growth environment for carbon nanotubes can thus be improved, allowing for efficient manufacturing of carbon nanotubes.

DETAILED DESCRIPTION

Figure 1:
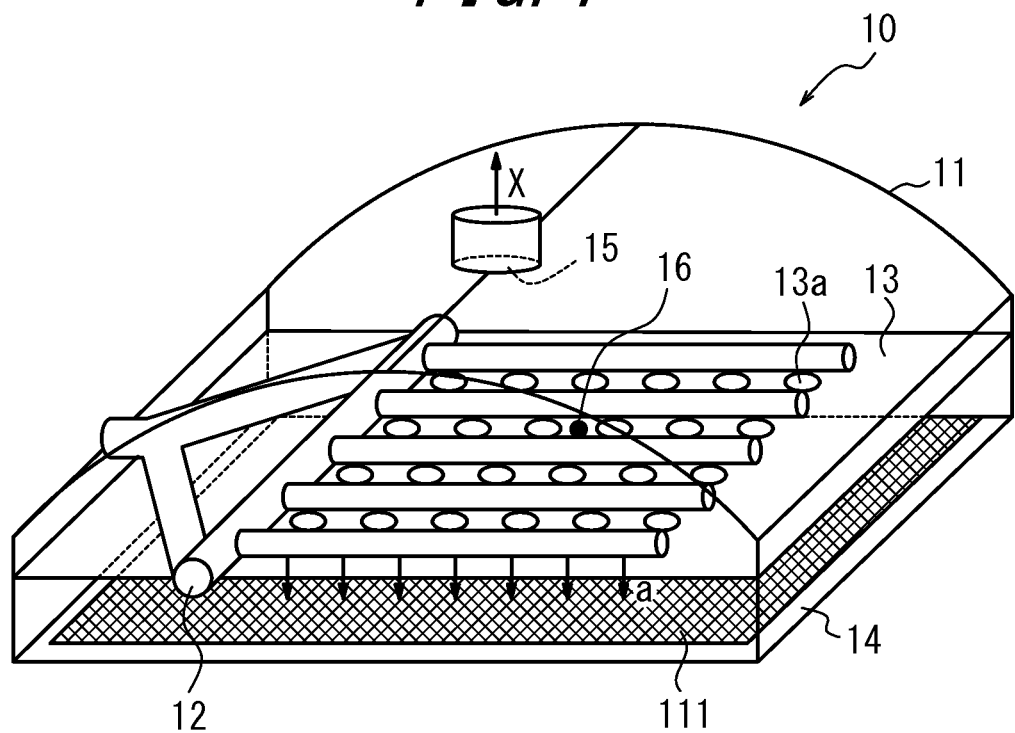
FIG. 1 schematically illustrates an embodiment of a growth unit in a CNT manufacturing apparatus used in my method of manufacturing.

Embodiments will be described below in detail. However, the following embodiments are in no way limiting.

My method of manufacturing CNTs (hereinafter also referred to simply as "my method of manufacturing") is a method of manufacturing CNTs by growing CNTs on a substrate that supports a catalyst on the surface of the substrate. My method of manufacturing includes a growing step to grow CNTs and a feedback control step to adjust the supply amount of catalyst activating material. A setting step to set the heating temperature at which at least one of the catalyst and the source gas is heated during the growing step may also be included.

[CNT]

First, the CNTs yielded by my method of manufacturing are described.

The CNTs manufactured by my method of manufacturing are preferably obtained by forming a structure in which multiple CNTs grown from a substrate are aligned in a particular direction (hereinafter referred to as an "aligned CNT aggregate").

The preferred specific surface area of the CNTs is 600 m$^2$/g or more, preferably 800 m$^2$/g or more, when the CNTs are mostly unopened. Such values are preferred because as the specific surface area is higher, impurities such as metals or carbon impurities in the manufactured CNTs can be reduced to lower than several dozen percent (approximately 40 mass %).

The specific surface area of carbon nanotubes may be calculated by a BET method.

The mass density of the CNTs constituting the aligned CNT aggregate is preferably 0.002 g/cm$^3$ or more to 0.2 g/cm$^3$ or less. If the mass density is 0.2 g/cm$^3$ or less, the binding between CNTs constituting the aligned CNT aggregate weakens, making it easier to uniformly disperse the aligned CNT aggregate when dispersing in a solvent or the like. In other words, setting the mass density to be 0.2 g/cm$^3$ or less makes it easier to obtain a homogenous dispersion liquid. If the mass density is 0.002 g/cm$^3$ or more, the unity of the aligned CNT aggregate improves, preventing the CNTs from becoming unbound and making the aligned CNT aggregate easier to handle.

An aligned CNT aggregate that is aligned in a particular direction preferably has high orientation. In this context, having high orientation refers to satisfying at least one of conditions 1. to 3. below.

1. When the aligned CNT aggregate is irradiated with X rays from a first direction parallel with the longitudinal direction of the CNTs and from a second direction orthogonal to the first direction, and an x-ray diffraction intensity is measured (θ-2θ method), a θ angle and a reflection direction exist such that the reflection intensity from the second direction is greater than the reflection intensity from the first direction. Furthermore, a θ angle and a reflection direction exist such that the reflection intensity from the first direction is greater than the reflection intensity from the second direction.

2. When the X-ray diffraction intensity is measured from a two-dimensional diffraction pattern image obtained by irradiating the aligned CNT aggregate with X rays from the direction orthogonal to the longitudinal direction of the CNTs (Laue method), a diffraction peak pattern indicating the presence of anisotropy appears.

3. A Herman's orientation factor calculated using the X-ray diffraction intensity obtained by the θ-2θ method or the Laue method is greater than 0 and is 1 or less, preferably 0.25 or more to less than 1.

The aligned CNT aggregate is preferably such that in the above-described X-ray diffraction, (i) diffraction intensities of a (CP) diffraction peak and a (002) peak based on packing between single-walled CNTs and (ii) diffraction peak intensities in the directions of X-rays that enter parallel (first direction) and perpendicular (second direction) to (100) and (110) peaks based on a six-membered carbon ring constituting the single-walled CNTs are different from each other.

In order for the aligned CNT aggregate to exhibit an orientation and a high specific surface area, the height of the aligned CNT aggregate is preferably in a range of 10 μm or more to 10 cm or less. A height of 10 μm or more improves the orientation. Furthermore, a height of 10 cm or less allows for rapid CNT generation, thereby suppressing the adhesion of carbonaceous impurities and improving the specific surface area.

The G/D ratio of the CNTs is preferably 3 or more, and more preferably 4 or more. The G/D ratio is an index commonly used to evaluate the quality of CNTs. In a Raman spectrum of CNTs as measured by a Raman spectroscopic instrument, vibration modes referred to as the "G band" (near 1,600 cm$^{-1}$) and "D band" (near 1,350 cm$^{-1}$) are observed. The G band is a vibration mode based on hexagonal lattice structures of graphite appearing as cylindrical surfaces of the CNTs, and the D band is a vibration mode based on amorphous locations. Therefore, as the peak intensity ratio of the G band to the D band (G/D ratio) is higher, the CNTs are evaluated as being more highly crystalline.

[Example of CNT Manufacturing Apparatus]

Figure 2:
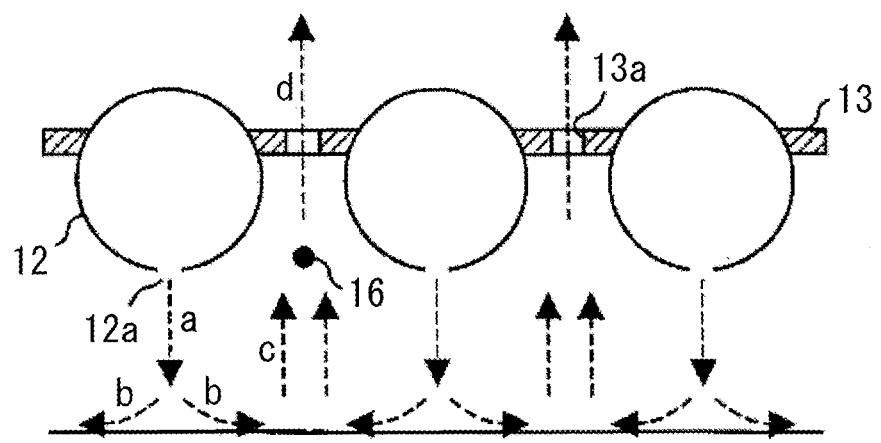
FIG. 2 schematically illustrates the flow of source gas within the growth unit illustrated in FIG. 1.
Figure 3:
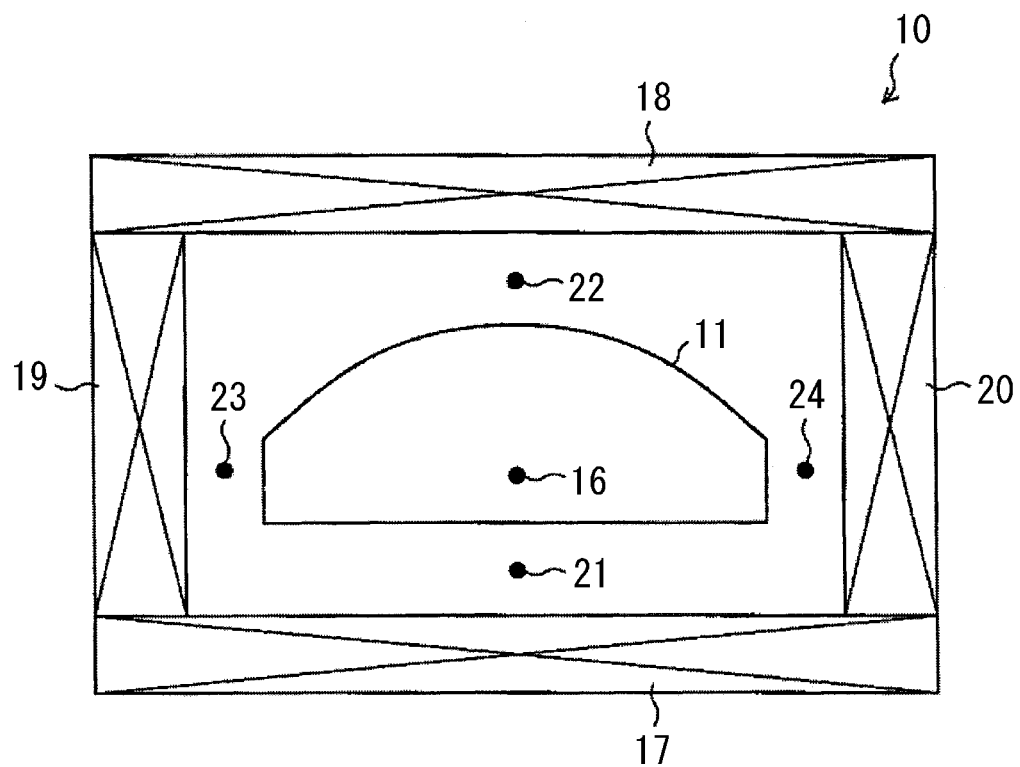
FIG. 3 schematically illustrates the position of a heater in the growth unit illustrated in FIG. 1.
Figure 4:
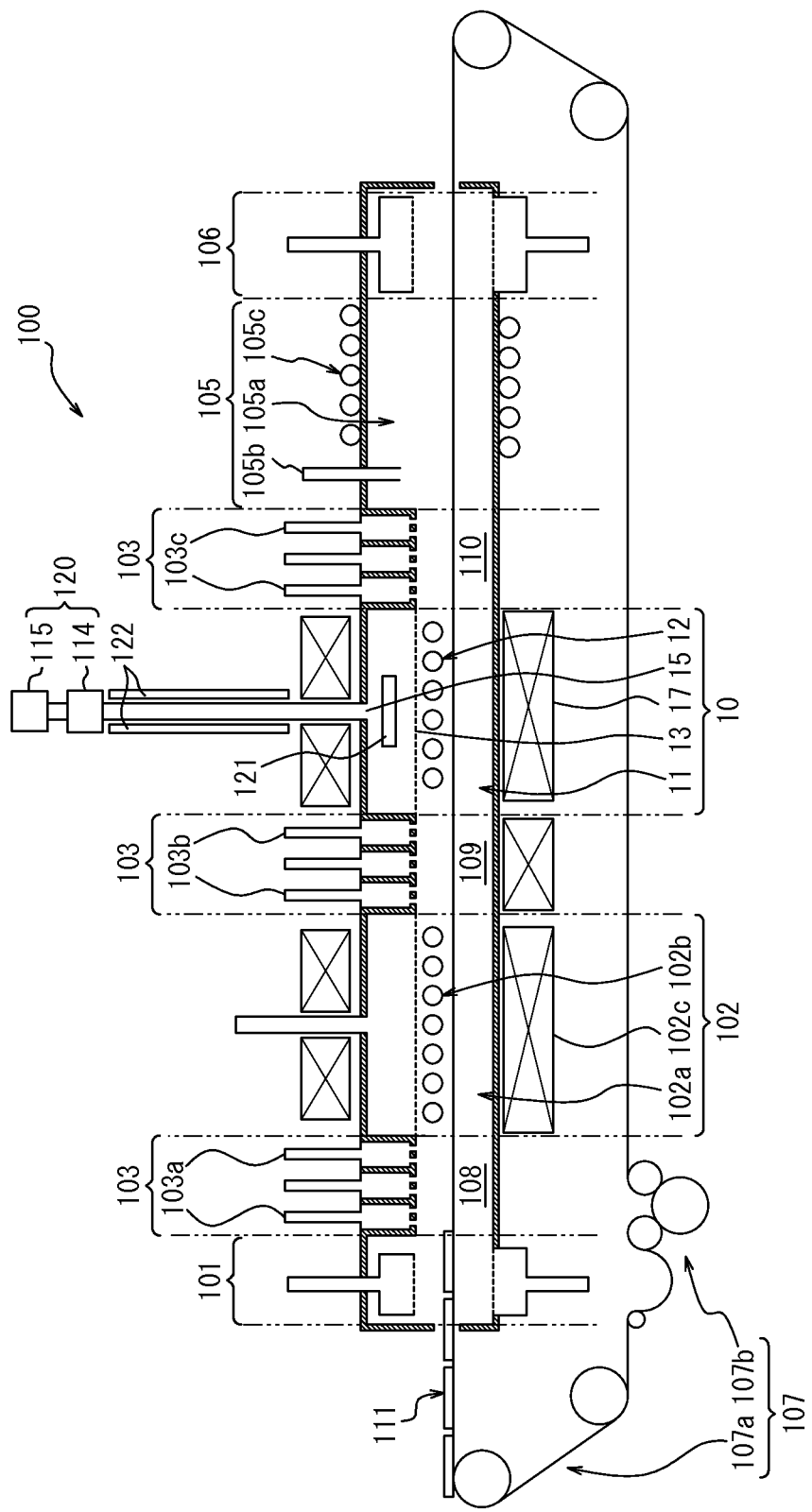
FIG. 4 schematically illustrates an embodiment of a CNT manufacturing apparatus used in my method of manufacturing.

Next, an embodiment of a CNT manufacturing apparatus used in my method of manufacturing is described based on FIGS. 1 to 4. FIG. 1 schematically illustrates an embodiment of a growth unit in a CNT manufacturing apparatus used in my method of manufacturing. FIG. 2 schematically illustrates the flow of source gas within the growth unit illustrated in FIG. 1. FIG. 3 schematically illustrates the position of a heater in the growth unit illustrated in FIG. 1. FIG. 4 schematically illustrates an embodiment of a CNT manufacturing apparatus used in my method of manufacturing.

As illustrated in FIG. 4, a CNT manufacturing apparatus 100 includes an inlet purge section 101, formation unit 102, gas mixing prevention means 103, growth unit 10, cooling unit 105, outlet purge section 106, transfer unit 107, and connection sections 108 to 110.

The formation unit 102 includes a formation furnace 102a, the growth unit 10 includes a growth furnace 11, and the cooling unit 105 includes a cooling furnace 105a. The inlet purge section 101 and the furnace space of the formation furnace 102a are spatially connected by the connection section 108. The furnace space of the formation furnace 102a and the furnace space of the growth furnace 11 are spatially connected by the connection section 109. Furthermore, the furnace space of the growth furnace 11 and the furnace space of the cooling furnace 105a are spatially connected by the connection section 110.

(Inlet Purge Section 101)

The inlet purge section 101 is provided at the inlet of the CNT manufacturing apparatus 100. The inlet purge section 101 is a set of devices for preventing outside air from flowing into the apparatus furnace through the inlet for introducing a substrate 111 that supports the catalyst for a CNT growth reaction. The inlet purge section 101 has the function of replacing, with a purge gas, the environment around the substrate 111 transferred into the apparatus.

The inlet purge section 101 has a gas curtain structure that ejects the purge gas from above and below in shower form. Outside air is thus prevented from entering into the manufacturing apparatus 100 through the inlet. The inlet purge section 101 may, for example, be structured by a furnace or chamber for retaining the purge gas, an ejector for ejecting the purge gas, and the like.

An inert gas is preferable as the purge gas. Nitrogen is particularly preferable in terms of safety, cost, purging properties, and the like.

When the inlet for the substrate 111 is always open, such as the case when the transfer unit 107 that transfers the substrate 111 is a belt-conveyor type, as in this embodiment, then the inlet purge section 101 preferably has the above-described gas curtain structure. With this structure, outside air can be prevented from entering into the CNT manufacturing apparatus 100 through the inlet for the substrate 111.

(Formation Unit 102)

The formation unit 102 is a set of devices for carrying out a formation step to reduce the catalyst on the substrate 111. The formation unit 102 has the function of causing the environment around the catalyst formed on the surface of the substrate 111 to become a reducing gas environment and of heating at least one of the catalyst and the reducing gas.

The formation unit 102 is formed by the formation furnace 102a for retaining the reducing gas, an ejection section 102b for ejecting the reducing gas into the formation furnace 102a, and a heater 102c for heating at least one of the catalyst and the reducing gas.

A shower head provided with a plurality of nozzles may be used as the reducing gas ejection section 102b. The ejection section 102b is disposed at a position that faces a catalyst formation surface of the substrate 111. A "position that faces" refers to a position such that an angle between the ejection axis line of each nozzle and a normal line to the substrate 111 is from 0° or more to less than 90°. Hence, the flow direction of gas ejected from the nozzles in the ejection section 102b is substantially orthogonal to the substrate 111.

Using such a shower head for the ejection section 102b allows for even scattering of the reducing gas over the substrate 111, thereby allowing for efficient reduction of the catalyst on the substrate 111. As a result, uniformity of the CNTs grown on the substrate 111 can be improved, and the consumption of reducing gas can be decreased.

The heater 102c may be any type of heater that can produce heat. For example, the heater 102c may be a resistance heater, an infrared heater, an electromagnetic induction heater, or the like. The heating temperature is preferably in a range of 400° C. to 1100° C.

The reducing gas ejected from the ejection section 102b is a gas generally having at least one of the effects of reducing the catalyst, promoting atomization of the catalyst into fine particles, which is a state suitable for CNT growth, and improving the activity of the catalyst. The reducing gas may, for example, be hydrogen gas, ammonia, water vapor, or a gas that is a mixture thereof. A mixed gas containing a mixture of the above with an inert gas such as helium gas, argon gas, nitrogen gas, or the like may also be used. The reducing gas is generally used in the formation step but may be used in the growing step as appropriate. When using a reducing gas such as hydrogen in the growing step, the reducing gas is normally supplied at a constant flow rate. Therefore, the use of a reducing gas such as hydrogen in the growing step has nearly no effect on the feedback control step, which is described in detail below.

(Growth Unit 10)

The growth unit 10 is a set of devices for carrying out the growing step to grow CNTs on the substrate by, for example, a chemical vapor deposition (CVD) method.

As illustrated in FIGS. 1 to 4, the growth unit 10 includes the growth furnace 11, ejection section 12, and exhaust section 13. An exhaust vent 15 (first exhaust vent) is disposed in the upper portion of the growth unit 10. As illustrated in FIGS. 1 and 2, the growth unit 10 includes a section for measuring gas component concentration 16 within the growth furnace 11. Furthermore, as illustrated in FIG. 3, the growth unit 10 includes heaters 17 to 20 around the growth furnace 11.

<Growth Furnace 11>

Next, the components constituting the growth unit 10 are described. The growth furnace 11 is a furnace for making an ambient environment of the substrate 111 to a source gas environment and retaining the source gas environment, and is a furnace for storing the substrate 111 when growing CNTs.

As illustrated in FIG. 1, the bottom of the growth furnace 11 acts as a mounting surface 14 for the substrate 111. The substrate 111 is mounted on the mounting surface 14 at the time of the growing step.

The exhaust vent 15 is disposed above the growth furnace 11. As viewed from the ejection section 12, the exhaust vent 15 is at the opposite side from the mounting surface 14 on which the substrate 111 is mounted. The exhaust vent 15 is for discharging the source gas that was ejected from nozzles 12a and was in contact with the substrate 111. The source gas supplied from the ejection section 12 is discharged outside of the growth furnace 11 in the direction of the arrow X from the exhaust vent 15 via the below-described exhaust section 13. A known method may be used as appropriate as the mechanism for discharging the source gas from the exhaust vent 15, for example suction by suction means such as a pump or the like.

The exhaust vent 15 is disposed on an inner wall of the growth furnace 11 and is an opening joined to pipework for discharging the source gas in the growth furnace 11 to the outside of the growth furnace 11. As viewed from the ejection section 12, the exhaust vent 15 is at the opposite side from the mounting surface 14 on which the substrate 111 is mounted and discharges the source gas that was ejected from nozzles 12a and was in contact with the substrate 111. The exhaust vent 15 and the pipework joined thereto are not, however, limited to this configuration. For example, a unit that is convex when viewed from the side, that has a surface corresponding to the exhaust section 13, and that has pipework connected at the opposite side from exhaust vents 13a may be adopted.

<Ejection Section 12>

The ejection section 12 is for supplying the source gas that is the raw material for CNTs and the catalyst activating material to the substrate 111. The ejection section 12 has a shape such that tubes are aligned in comb-like fashion. A nozzle row formed by a line of a plurality of nozzles 12a is provided in each tube. The source gas and catalyst activating material can be supplied more uniformly to the substrate 111 by arranging these tubes, in which nozzle rows are thus provided, in a comb-like fashion.

As illustrated in FIG. 2, each nozzle 12a is disposed at a position that faces the catalyst formation surface of the substrate 111. A "position that faces" refers to a position such that an angle between the ejection axis line of each nozzle 12a and a normal line to the substrate 111 is from 0° or more to less than 90°. Hence, the flow direction of gas ejected from the nozzles 12a in the ejection section 12 is substantially orthogonal to the substrate 111. Adopting this structure for the ejection section 12 allows for even scattering of the source gas and the catalyst activating material over the substrate.

The source gas and the catalyst activating material may be supplied to the inside of the growth furnace 11 from different supply tubes or from the same supply tube. When supplying the source gas and the catalyst activating material to the growth furnace 11 from the same supply tube, the source gas and the catalyst activating material may be ejected from different nozzles 12a or from the same nozzles 12a.

In the catalyst activating material supply tube or the like, the ejection section 12 includes a measurement device to measure the catalyst activating material concentration. The supply amount of catalyst activating material is measured by this measuring device, and adjusting the supply amount using the measured value allows for a stable supply of catalyst activating material with little change over time.

Apart from the ejection section 12, the growth furnace 11 may include a section for adding the catalyst activating material (not illustrated) that supplies the catalyst activating material into the growth furnace 11. When separately providing this section for adding the catalyst activating material, the ejection section 12 becomes a section for supplying the source gas. While the method of supplying the catalyst activating material in the section for adding the catalyst activating material is not limited, examples include supplying through a bubbler, supplying by vaporizing a solution containing catalyst activating material, supplying the catalyst activating material directly in a gaseous state, and supplying by liquefying and vaporizing a solid catalyst activating material. As the section for adding the catalyst activating material, it is possible to build a supply system using various devices such as a vaporizer, mixer, stirrer, diluter, spray, pump, compressor, and the like.

<Exhaust Section 13>

The exhaust section 13 is a member provided between the ejection section 12 and the exhaust vent 15 and includes a surface on which is provided a plurality of exhaust vents 13a that discharge the source gas that was in contact with the substrate 111 towards the exhaust vent 15.

The exhaust section 13 is disposed closer to the exhaust vent 15 than the nozzles 12a are. In other words, all of the exhaust vents 13a are closer to the exhaust vent 15 than are all of the nozzles 12a. In this way, before the residual gas is discharged from the entire growth unit 10, the residual gas is removed from between the substrate 111 and the nozzles 12a, preventing the residual gas from returning and mixing into the space between the substrate 111 and the nozzles 12a.

The exhaust section 13 has a plate-like structure with a surface facing the mounting surface 14 of the substrate 111. The exhaust vents 13a are provided on this surface. By including this surface, a space is formed between the substrate 111 and the surface of the exhaust section 13. This space is of course smaller than the entire interior space of the growth furnace 11 in the case that such a surface is not included. The region in which the residual gas is retained and diffuses is therefore reduced. Since the residual gas is rapidly discharged from such a small region, the concentration of the source gas and the like between the substrate 111 and the ejection section 12 can be made more uniform.

The flow of source gas within the growth unit 10 is now described. As illustrated in FIG. 2, first the source gas is ejected in the direction of the arrow a from the nozzles 12a towards the substrate 111. The ejected source gas flows along the surface of the substrate 111 in the directions of the arrows b. The source gas then flows in the direction of the arrow c, moves in the direction of the arrow d, and is discharged from the exhaust vents 13a, which are positioned between neighboring nozzles 12a. In this way, the composition of the source gas and the flow velocity of the source gas can be made more uniform across the entire surface of the substrate 111, and even if the substrate 111 has a large area, CNTs with more uniform quality can be grown on the substrate 111.

<Section for Measuring Gas Component Concentration 16>

As illustrated in FIGS. 1 to 2, in the growth furnace 11, a section for measuring gas component concentration 16 that measures the concentration of a gas component around the substrate 111 during the growing step is provided. By measuring the concentration of a gas component around the substrate 111, the section for measuring gas component concentration 16 monitors the CNT growth environment around the substrate 111.

The section for measuring gas component concentration 16 may be formed by a known gas sensor and gas analysis device or the like. The section for measuring gas component concentration 16 may be placed at any position that allows for measurement of the concentration of a gas component around the substrate. Among these positions, from the perspective of accurately measuring the concentration of the gas component, the section for measuring gas component concentration 16 is preferably provided between the substrate 111 contained in the growth furnace 11 and the exhaust section 13, more preferably on the exhaust section 13 side of the nozzles 12a. A plurality of sections for measuring gas component concentration 16 may be provided to allow for measurement of the gas component concentration at a plurality of positions around the substrate 111.

Like the phrases "near the substrate" or "surrounding the substrate", the phrase "around the substrate" refers to a range up to positions at a certain distance from the substrate, i.e. the space up to positions at a certain distance from the substrate. Specifically, "around the substrate" refers to a range such that the minimum distance to the substrate is 20 cm or less, preferably a range such that the minimum distance to the substrate is 10 cm or less, and more preferably a range such that the minimum distance to the substrate is 5 cm or less.

<Heater>

As illustrated in FIG. 3, the heaters 17 to 20 heat at least one of the catalyst and the source gas. The heater 17 is a bottom side heater positioned below the growth furnace 11, and the heater 18 is a top side heater positioned opposite the heater 17 so as to sandwich the growth furnace 11, i.e. positioned above the growth furnace 11. The heater 19 and heater 20 are lateral heaters positioned to the sides of the growth furnace 11 and oppose each other with the growth furnace 11 therebetween. In other words, the heaters 17 to 20 are provided so as to surround the area around the growth furnace 11.

In the growing step, by heating the inside of the growth furnace 11 from the outside of the growth furnace 11 with the heaters 17 to 20, at least one of the catalyst supported on the substrate introduced into the growth furnace 11 and the source gas supplied into the growth furnace 11 is heated.

The heaters 17 to 20 may be any type of heater that can heat the growth furnace 11. For example, the heaters 17 to 20 may be resistance heaters, infrared heaters, electromagnetic induction heaters, or the like.

The temperature of the heater 17 is adjusted based on a value indicated by a thermocouple 21 provided between the heater 17 and the growth furnace 11. The temperature of the heater 18 is adjusted based on a value indicated by a thermocouple 22 provided between the heater 18 and the growth furnace 11. The temperature of the heater 19 is adjusted based on a value indicated by a thermocouple 23 provided between the heater 19 and the growth furnace 11. The temperature of the heater 20 is adjusted based on a value indicated by a thermocouple 24 provided between the heater 17 and the growth furnace 11.

The above-described growth furnace 11 may include a reaction gas ejection section 121. The pipework that conducts the gas that has passed through the exhaust vent 15 to outside the growth unit 10 may include an exhaust flow stabilizing section 120.

The reaction gas refers to a gas that reduces carbon solids that adhere to the inside of the pipework when the gas that has passed through the exhaust vent 15 (residual gas) is conducted outside the growth unit 10. The reaction gas has a function to suppress generation of carbon solids that adhere to the piping by, for example, changing the residual gas into a light alkane, carbon monoxide, or carbon dioxide.

The reaction gas preferably includes hydrogen atoms and/or oxygen atoms. Examples of the reaction gas include hydrogen, ammonia, oxygen, ozone, water vapor, and the like. Among these, hydrogen and oxygen are preferable, as these gases are easy to handle and have a large effect of suppressing the generation of carbon solids. For the chemical reaction between the residual gas and the reaction gas to proceed efficiently, measures such as the following may be taken: (i) after mixing the residual gas and the reaction gas, the gases may be maintained at a high temperature, (ii) the reaction gas may be set to a high concentration, or (iii) a metal catalyst may be used. When maintaining the residual gas and the reaction gas at a high temperature after mixing, the temperature is preferably 400° C. or more and more preferably 600° C. or more.

The amount of reaction gas supplied into the residual gas is preferably controlled so that the concentration of the reaction gas is, for example, 5% or more, more preferably 9% or more, as a volume fraction (converted to standard conditions) of the total amount of gas discharged. When using oxygen as the reaction gas, the supply amount needs to be kept at or below the critical oxygen concentration, determined in accordance with the carbon source of the source gas being used, in order to avoid the danger of explosion. When using a gas other than a gas that includes oxygen atoms (oxygen, ozone, or water), the volume fraction of the reaction gas in the total of the residual gas and the reaction gas is more preferably smaller than 100%. Nickel, ruthenium, palladium, platinum, or the like may be used as the metal catalyst. This reaction gas may be diluted with an inert gas.

<Reaction Gas Ejection Section 121>

As illustrated in FIG. 4, the CNT manufacturing apparatus 100 includes a reaction gas ejection section 121 that ejects the above-described reaction gas. The reaction gas ejection section 121 needs to be designed so that the reaction gas does not come into contact with the catalyst and source gas before the source gas is used for CNT growth, and so that the reaction gas is discharged after being mixed well with the source gas that has been used for CNT growth (residual gas). For example, the reaction gas ejection section 121 may be designed so that the reaction gas is directly ejected into the space in which the residual gas discharged from the exhaust section 13 is accumulated to be sent to the exhaust vent 15 (the space that is partitioned by the surface of the exhaust section 13). A plurality of reaction gas ejection sections 121 may be provided. As the temperature of the gas that is a mixture of the residual gas and the reaction gas is higher, the chemical reaction between the residual gas and the reaction gas proceeds, and the generation of carbon solids can be prevented. Therefore, the reaction gas may be heated to a high temperature in advance.

<Exhaust Flow Stabilizing Section 120>

The exhaust flow stabilizing section 120 is a device provided in the pipework (exhaust pipe) that conducts the gas that has passed through the exhaust vent 15 to outside the growth unit 10. Even if carbon solids adhere to the pipework due to manufacturing CNTs over an extended period of time, this device stabilizes the exhaust flow from the pipework over time. The exhaust flow stabilizing section 120 is at least provided with exhaust flow variation means 114 for varying the exhaust flow in the exhaust pipe and exhaust flow measuring means 115 for measuring the exhaust flow in the pipework. Additional means for preventing carbon solids from adhering in the pipework, such as carbon solid adhesion preventing means 122, may be provided.

The exhaust flow stabilizing section 120 controls the exhaust flow with the exhaust flow variation means 114 so that the exhaust flow measured by the exhaust flow measuring means 115 is, for example, preferably in a range having a suitable exhaust flow, set in advance for the pipework, as a center value with a relative error of ±20%, more preferably ±10%. This range is referred to as a "control range". In greater detail, for example using a measured pressure difference and exhaust gas temperature, the exhaust flow measuring means 115 first calculates (measures) the exhaust flow by calculation based on a conversion formula. Next, when the exhaust flow exceeds the upper limit of the control range set in advance, an exhaust flow control means (not illustrated) provided in the exhaust flow variation means 114 performs control to lower the exhaust flow, for example by reducing the suction force of the exhaust flow variation means 114. Conversely, when the exhaust flow falls below the lower limit of the control range, the exhaust flow control means performs control to increase the exhaust flow, for example by increasing the suction force of the exhaust flow variation means 114. Adjustment of the exhaust flow may be performed automatically or manually. The exhaust flow from the exhaust vent can thus be controlled stably.

<Exhaust Flow Measuring Means 115>

The exhaust flow measuring means 115 is a device, provided in the pipework that conducts the gas that has passed through the exhaust vent 15 to outside the growth unit 10, for measuring the exhaust flow of the gas discharged through the exhaust vent 15. For example, the exhaust flow measuring means 115 may have a function to measure the exhaust flow by measuring the pressure difference between at least two separate locations in the pipework and more preferably also has a function to measure the gas temperature within the pipework. Specific examples include a differential pressure gauge for measuring the pressure difference and a thermocouple for measuring the gas temperature. The pressure difference that can be accurately measured with a differential pressure gauge that is currently commercially available is, for example, 0.1 Pa or more, more preferably 1 Pa or more. Therefore, so that the pressure difference occurring within the measuring range of the exhaust flow becomes, for example, 0.1 Pa or more, more preferably 1 Pa or more, the two measured locations are preferably separated sufficiently, or a pressure drop section for generating a measurable pressure drop is preferably inserted within the measurement interval. In order, for example, to improve the flow measurement accuracy, the number of pressure measurement locations may be increased to three or more. If the pressure measurement locations are too close, the pressure difference cannot be measured accurately. Hence, the pressure measurement interval more preferably extends over a distance of 0.5 D or more, where D is the inner diameter of the exhaust vent.

The pressure drop section may be any member that is insertable in the pipework and that reduces the cross-sectional area of the pipe, such as an orifice plate, Venturi tube, nozzle, perforated plate, or the like. Members that are normally commercially available adhere to prescribed standards (JIS Z8762-1 to 4), and the shape, measurement method, and the like are standardized. When using a pressure drop section that conforms to standards, the flow is calculated using the calculation formula stipulated by the standards. Conditions on the applicable range, however, are a pipe inner diameter of 50 mm or more and a Reynolds number of 5000 or more. As estimated from the Reynolds number, the minimum necessary flow is approximately several hundred sLm, making a large diameter exhaust vent and a large amount of exhaust conditions for flow measurement.

The exhaust flow measuring means 115 preferably uses a thermal fluid simulation, as doing so allows for accurate measurement of the exhaust flow even for a pipe diameter and flow conditions that are outside of the applicable range for a regular method. For example, when the pressure drop section is an orifice plate, the relationship between the pressure difference ΔP of the drop in pressure and the flow F is given by Equation (1) below.

[Equation 1]

$$F[sLm] = \sqrt{\frac{\Delta P[Pa]}{\alpha}} \quad (1)$$

In Equation (1), α is a function for the temperature, density, and viscosity of the exhaust gas. By deriving α from the results of a thermal fluid simulation, conversion between the pressure difference and the exhaust flow can be made accurately. When using a thermal fluid simulation, the pressure drop section may have any shape, and no limit is placed on the measurable flow range.

<Exhaust Flow Variation Means 114>

The exhaust flow variation means 114 is a device, provided in the pipework that conducts the gas that has passed through the exhaust vent 15 to outside the growth unit 10, for varying the flow of gas discharged through the pipework. The exhaust flow variation means 114 has a function to vary the flow of gas that is discharged. Based on the results of measurement by the exhaust flow measuring means 115, the exhaust flow variation means 114 can vary the exhaust flow in the exhaust vent 15. Examples of the exhaust flow variation means 114 include a gas suction device for suctioning gas such as a blower, pump, or ejector, or a flow regulation valve such as a ball valve, cylinder valve, gate valve, or the like. By using an ejector that has a gas (air, nitrogen, or the like being preferable) as the driving fluid and employing a method to control the suction force of the ejector by controlling the flow of the driving fluid with a mass flow controller, the exhaust flow variation means 114 can suppress the fluctuation in the exhaust flow, which is more preferable for manufacturing CNTs.

<Carbon Solid Adhesion Preventing Means 122>

The carbon solid adhesion preventing means 122 prevents carbon solids from adhering to the pipework by (i) heating, to a high temperature, the residual gas flowing through the pipework that conducts the gas that has passed through the exhaust vent 15 to outside the growth unit 10, and/or (ii) maintaining the residual gas at a high temperature. In this embodiment, the carbon solid adhesion preventing means 122 is a device, in the pipework that conducts the gas that has passed through the exhaust vent 15 to outside the growth unit 10, for preventing carbon solids from adhering to the pipework in the interval in which the pressure difference is measured by the exhaust flow measuring means 115 by heating the inside of the pipework in the interval to a high temperature and/or maintaining the inside of the pipework at a high temperature. Providing the carbon solid adhesion preventing means 122 reduces carbon solids adhering to the pipework in the interval, thereby allowing for accurate measurement of the exhaust flow over an extended period of time. Therefore, continuous manufacturing of CNTs can be maintained stably over a longer period of time.

Examples of the carbon solid adhesion preventing means 122 include a heater that heats the pipework, insulating material that maintains the temperature of the pipework, and the like. The amount of adhered carbon solids decreases as the temperature of the exhaust gas is higher. The carbon solid adhesion preventing means 122 for example heats the exhaust gas to, and/or maintains the exhaust gas at, a temperature of 150° C. or more, preferably 300° C. or more. The carbon solid adhesion preventing means 122 preferably maintains the temperature of the exhaust gas at 700° C. or less. A temperature of 700° C. or less for the exhaust gas allows for prevention of problems such as deterioration in strength due to carburizing of the pipework and difficulty in forming a gas seal for the high temperature gas, which would require full welding of the pipework.

(Cooling Unit 105)

The cooling unit 105 is a set of devices for implementing the cooling step to cool the substrate 111 on which the CNTs have grown. The cooling unit 105 has a function to cool the CNTs and the substrate 111 after the growing step.

Cooling the substrate 111, on which the CNTs have grown, in the cooling unit 105 prevents oxidation of the CNTs, catalyst, and substrate 111 after the growing step.

The cooling unit 105 has a configuration combining a water cooling system with an air cooling system and is formed by the cooling furnace 105a for retaining an inert gas, a coolant gas ejection section 105b that ejects the inert gas into the cooling furnace 105a, and a water-cooled cooling tube 105c disposed to surround the internal space of the cooling furnace 105a. The cooling unit 105 may be configured as only a water cooling system or only an air cooling system.

(Connection Sections 108 to 110)

The connection sections 108 to 110 are a set of devices that spatially connect the furnace spaces of the above-described units and that serve to prevent the substrate 111 from being exposed to outside air when the substrate 111 is transferred from one unit to another. Examples of the connection sections 108 to 110 include a furnace or chamber capable of shielding the environment around the substrate from outside air and of passing the substrate 111 from one unit to another.

The inlet purge section 101 and the formation unit 102 are spatially connected by the connection section 108. An exhaust section 103a of the gas mixing prevention means 103 is disposed in the connection section 108, and a mixed gas including the purge gas ejected in the inlet purge section 101 and the reducing gas ejected from the ejection section 102b in the formation furnace 102a is discharged from the exhaust section 103a. In this way, the purge gas is prevented from mixing into the interior space of the formation furnace 102a, and the reducing gas is prevented from mixing into the inlet purge section 101 side.

The formation unit 102 and the growth unit 10 are spatially connected by the connection section 109. An exhaust section 103b of the gas mixing prevention means 103 is disposed in the connection section 109, and the reducing gas in the interior space of the formation furnace 102a is discharged from the exhaust section 103b along with the source gas and the catalyst activating material in the interior space of the growth furnace 11. In this way, the source gas and the catalyst activating material are prevented from mixing into the interior space of the formation furnace 102a, and the reducing gas is prevented from mixing into the interior space of the growth furnace 11.

The growth unit 10 and the cooling unit 105 are spatially connected by the connection section 110. An exhaust section 103c of the gas mixing prevention means 103 is disposed in the connection section 110, and a mixed gas including the source gas and catalyst activating material in the interior space of the growth furnace 11 and the inert gas in the interior space of the cooling furnace 105a is discharged from the exhaust section 103c. In this way, the source gas and the catalyst activating material are prevented from mixing into the interior space of the cooling furnace 105a, and the inert gas is prevented from mixing into the interior space of the growth furnace 11.

The CNT manufacturing apparatus 100 may be further provided with heating means to heat the connection section 110 between the growth unit 10 and the cooling unit 105. If the temperature near the outlet of the growth furnace 11 reduces, a degradation product of the source gas may become amorphous carbon and deposit on the top of the CNTs. As a result, the G/D ratio at the top of the CNTs growing perpendicularly from the substrate may become lower than the G/D ratio at the bottom.

Heating the connection section 110 between the growth unit 10 and the cooling unit 105, however, suppresses the formation of amorphous carbon and reduces the difference between the G/D ratio at the top and the G/D ratio at the bottom. It thus becomes possible to achieve CNTs with stable quality.

A specific configuration of the heating means may, for example, be to heat the seal gas used in the portion of the below-described gas mixing prevention means 103 between the growth unit 10 and the cooling unit 105. Heating the seal gas makes it possible to heat the outlet of the growth furnace 11 and the area around the outlet.

(Gas Mixing Prevention Means 103)

The gas mixing prevention means 103 is a set of devices for implementing the function of preventing the gases located in the furnace space of each unit from mixing with each other. The gas mixing prevention means 103 is provided in the connection sections 108 to 110 that spatially connect the furnace space of each unit. The gas mixing prevention means 103 includes the exhaust sections 103a to 103c that discharge the gas in the connection sections 108 to 110, and/or in each unit near the connection sections 108 to 110, outside the system.

The gas mixing prevention means 103 is not limited to the structure in this embodiment and may, for example, be a gate valve device that mechanically shuts off the spatial connection between units at all times other than when the substrate 111 is being transferred from one unit to another. The gas mixing prevention means 103 may also be a gas curtain device that shuts off the spatial connection between units by inert gas ejection.

In order to reliably prevent gas mixing, a combination of an exhaust device with a gate valve device and/or gas curtain is preferably used. However, from the perspective of efficient continuous CNT growth by transferring the substrate from one unit to another without interruption, and from the perspective of simplifying the manufacturing apparatus, the exhaust device is more preferably used alone.

The gas mixing prevention means 103 may include at least one each of (i) a seal gas ejection section that ejects a seal gas along the aperture plane of the inlet and the outlet for the substrate 111 in each furnace, and (ii) an exhaust section that mainly suctions the ejected seal gas (and other neighboring gas) so that this gas does not enter into each furnace and discharges the suctioned gas outside the apparatus. By being ejected along the aperture planes of the furnaces, the seal gas blocks the inlet and outlet of the furnaces and can prevent gas outside the furnaces from entering into the furnaces. Also, discharging the seal gas outside the manufacturing apparatus can prevent the seal gas from entering into the furnaces.

The seal gas is preferably an inert gas. In particular, from the perspectives of safety, cost, and the like, the seal gas is preferably nitrogen. The seal gas ejection section and the exhaust section may be arranged by placing one exhaust section next to one seal gas ejection section, or the exhaust section may be disposed to face the seal gas ejection section with a mesh belt 107a of the transfer unit 107 that transfers the substrate 111 therebetween. The seal gas ejection section(s) and the exhaust section(s) are preferably disposed so that the overall structure of the gas mixing prevention means 103 is symmetrical in the furnace length direction.

For example, two seal gas ejection sections may be provided on each side of one exhaust section for a structure that, centering on the exhaust section, is symmetrical in the furnace length direction. The total gas flow ejected from the seal gas ejection section(s) and the total gas flow discharged from the exhaust section(s) is preferably approximately the same amount. Gas from the space on either side of the gas mixing prevention means can thus be prevented from mixing together, and the seal gas can also be prevented from flowing into the space on either side. By providing this gas mixing prevention means 103 at both ends of the growth furnace 11, the flow of seal gas and the flow of gas inside the growth furnace 11 can be prevented from interfering with each other. It is also possible to prevent a disturbance in gas flow due to seal gas entering into the growth furnace 11. Hence, a suitable apparatus for continuous manufacturing of CNTs can be achieved.

The exhaust amount Q of each of the exhaust sections 103a to 103c in the CNT manufacturing apparatus 100 cannot be independently determined. The exhaust amount needs to be adjusted in accordance with the amount of gas supplied to the entire apparatus (the reducing gas flow, source gas flow, cooling gas flow, and the like). A necessary condition for satisfying gas mixing prevention can, however, be represented by the following equation:

$$Q \geq 4DS/L$$

where D is the diffusion coefficient of a gas to be prevented from entering, S is the sectional area of a boundary at which the gas is prevented from entering, and L is the length of the exhaust section (in the furnace length direction). The exhaust amount of each of the exhaust sections 103a to 103c is set so that this conditional equation is satisfied and so that a balance between gas supply and exhaust in the entire apparatus is maintained.

Inflow of the source gas into the interior space of the formation furnace 102a exerts a harmful influence on the growth of the CNTs. Thus, the gas mixing prevention means 103 preferably has a function to maintain the number concentration of carbon atoms in the reducing gas environment inside the formation furnace 102a at $5 \times 10^{22}$ atoms/m$^3$ or less, more preferably $1 \times 10^{22}$ atoms/m$^3$ or less. The number concentration of carbon atoms is calculated according to Equation (2) below, where with respect to the types of gas contained in the reducing gas environment (i=1, 2, . . . ), the concentration (ppmv) is denoted by $D_1$, $D_2$, . . . , the density in standard condition (g/m$^3$) is denoted by $\rho_1, \rho_2, \ldots$, the molecular weight is denoted by $M_1$, $M_2, \ldots$, the number of carbon atoms contained in each gas molecule is denoted by $C_1, C_2, \ldots$, and Avogadro's number is denoted by $N_A$.

[Equation 2]

$$\text{(Number concentration of carbon atoms)} = \sum_i C_i \frac{\rho_i D_i}{M_i} N_A \quad (2)$$

The production quantity and quality of the CNTs can be maintained high by keeping the number concentration of carbon atoms in the reducing gas environment inside the formation furnace 102*a* at $5 \times 10^{22}$ atoms/m³ or less. That is, setting the number concentration of carbon atoms to $5 \times 10^{22}$ atoms/m³ or less makes it possible, in the formation step, to highly exhibit the effects of reducing the catalyst, promoting atomization of the catalyst into fine particles suitable for growth of the CNTs, and improving the activity of the catalyst, and also to maintain a high production quantity and quality of the CNTs during the growing step.

(Outlet Purge Section 106)

The outlet purge section 106, which has nearly the same structure as the inlet purge section 101, is provided at the outlet of the CNT manufacturing apparatus 100. The outlet purge section 106 is a set of devices for preventing outside air from flowing into the CNT manufacturing apparatus 100 through the outlet for discharging the substrate 111. The outlet purge section 106 has the function of changing the environment around the substrate 111 into a purge gas environment.

The outlet purge section 106 prevents outside air from entering the cooling furnace 105*a* through the outlet by ejecting purge gas from above and below in shower form. The outlet purge section 106 may be structured by a furnace or chamber for retaining the purge gas environment, an ejector for ejecting the purge gas, and the like.

An inert gas is preferable as the purge gas. Nitrogen is particularly preferable in terms of safety, cost, purging properties, and the like.

When the outlet for the substrate 111 is always open, such as the case when the transfer unit 107 that transfers the substrate 111 is a belt-conveyor type, then the outlet purge section 106 preferably has a gas curtain structure such as the one described above. With this structure, outside air can be prevented from entering into the CNT manufacturing apparatus 100 through the outlet for the substrate 111.

(Transfer Unit 107)

The transfer unit 107 is a set of devices necessary for introducing a plurality of substrates 111 consecutively into the CNT manufacturing apparatus 100. The transfer unit 107 includes the mesh belt 107*a* and a belt drive section 107*b*. The substrate 111 is transferred by the transfer unit 107 through each furnace space in the order of the formation unit 102, growth unit 10, and cooling unit 105.

The transfer unit 107 of the CNT manufacturing apparatus 100 is a belt-conveyor type and transfers the substrate 111, which has catalyst formed on the surface thereof, from the interior space of the formation furnace 102*a* through the interior space of the growth furnace 11 into the interior space of the cooling furnace 105*a*. The transfer unit 107 for example transfers the substrate 111 with the mesh belt 107*a* driven by the belt drive section 107*b* using a reducer-equipped electric motor. The interior space of the formation furnace 102*a* and the interior space of the growth furnace 11 are spatially connected by the connection section 109, and the interior space of the growth furnace 11 and the interior space of the cooling furnace 105*a* are spatially connected by the connection section 110. The mesh belt 107*a* on which the substrate 111 is mounted can thus pass through each furnace.

In the case that the CNT manufacturing apparatus can manufacture CNTs consecutively and is provided with a transfer unit, the specific structure thereof is not limited to the above-described structure. For example, a robot arm, a robot arm driving device, and the like in a multi-chamber system may be adopted.

(Materials for Apparatus Components Exposed to the Reducing Gas or the Source Gas)

In the CNT manufacturing apparatus 100, the apparatus components exposed to the reducing gas or the source gas include a portion of the formation unit 102, growth unit 10, transfer unit 107, gas mixing prevention means 103, and connection sections 108 to 110. Specifically, examples of apparatus components exposed to the reducing gas or the source gas include the formation furnace 102*a*, the ejection section 102*b* for the reducing gas, the growth furnace 11, the ejection section 12 for the source gas, the mesh belt 107*a*, the exhaust sections 103*a* to 103*c* in the gas mixing prevention means 103, the furnaces of the connection sections 108 to 110, and the like.

The material for the apparatus components exposed to the reducing gas or the source gas may be a material that can withstand high temperatures, such as quartz, heat-resistant ceramic, metal, and the like. From the perspectives of processing precision, degree of freedom of processing, cost, and the like, metal is preferable. Heat-resistant alloys and the like are examples of metal. Examples of heat-resistant alloys include heat-resistant steel, stainless steel, and nickel-based alloys. In general, heat-resistant steel refers to steel that contains Fe as the principal component and other alloys in concentrations of 50% or less. Stainless steel generally refers to steel that contains Fe as the principal component, other alloys in concentrations of 50% or less, and approximately 12% or more of Cr. Furthermore, examples of nickel-based alloys include alloys obtained by adding Mo, Cr, Fe, and the like to Ni. Specifically, SUS 310, Inconel 600, Inconel 601, Inconel 625, Incoloy 800, MC Alloy, Haynes 230 Alloy, and the like are preferable in terms of heat resistance, mechanical strength, chemical stability, low cost, and other such considerations.

When forming the furnace inner wall and/or components used in the furnace from metal, the material is preferably a heat-resistant alloy, and the surface is preferably plated with molten aluminum or polished so that the surface has an arithmetic average roughness Ra≤2 μm. This structure makes it possible to reduce the carbon contaminants that adhere to the wall surface when growing CNTs in a high-carbon environment. A decrease in production quantity and a deterioration in quality of CNTs can thus be prevented, making this structure appropriate.

The arithmetic average roughness is defined in conformance with JIS B0601:2001.

<Molten Aluminum Plating>

Molten aluminum plating refers to a process of forming an aluminum or aluminum alloy layer on the surface of an object by dipping the object into a bath of molten aluminum. The following is an example of how to carry out this process. The surface of an object (base metal) is washed (preprocessed), and then the object is dipped into a bath of molten aluminum at approximately 700° C., thereby causing the molten aluminum to disperse into the surface of the base metal so as to form an alloy of the base metal and aluminum. Aluminum is thus adhered to the alloy layer when the base metal is withdrawn from the bath. Furthermore, a process may then be performed to subject the alumina layer and aluminum layer in the surface layer to low-temperature thermal diffusion, thereby exposing the Fe—Al alloy layer below.

<Polishing>

Examples of a method of polishing the heat-resistant alloy so that the arithmetic average roughness Ra is ≤2 µm include mechanical polishing as typified by buffing, chemical polishing that involves the use of a chemical, electrolytic polishing that is carried out while passing an electric current through an electrolyte, and complex electrolytic polishing that is a combination of mechanical polishing and electrolytic polishing.

In this way, in the CNT manufacturing apparatus 100, substrates 111 that have catalyst on the surface thereof are continuously transferred by the transfer unit 107, and the substrates 111 consecutively pass through the inlet purge section 101, formation unit 102, growth unit 10, cooling unit 105, and outlet purge section 106. During that time, the catalyst is reduced in a reducing gas environment in the formation unit 102, CNTs grow on the surface of the substrate in a source gas environment in the growth unit 10, and the result is cooled in the cooling unit 105.

In the above embodiment, the units are disposed in the order of the formation unit 102, growth unit 10, and cooling unit 105, and the furnace spaces are spatially connected by the connection sections 108 to 110. In a CNT manufacturing apparatus used with my method of manufacturing, however, a plurality of units that implement steps other than the formation step, growing step, and cooling step may be added at some position, and the furnace spaces of the units may be spatially connected by connection sections.

In the above embodiment, the formation unit 102, growth unit 10, and cooling unit 105 have been described as being arranged linearly. This example is not, however, limiting. These units may, for example, be in a circular configuration.

Furthermore, in the above embodiment, a suitable configuration for continuously manufacturing CNTs has been described in which the formation unit 102 and growth unit 10 are provided separately, and substrates 111 are continuously transferred between these units. The CNT manufacturing apparatus used with my method of manufacturing, however, is not limited to this configuration. The CNT manufacturing apparatus may, for example, be a batch-type manufacturing apparatus that performs the formation step and the growing step in one furnace. In this case, for example the reducing gas necessary in the formation step may be supplied by an ejection section or the like in the growth unit provided in the CNT manufacturing apparatus. This offers the advantage of forming the catalyst layer on the substrate more uniformly.

[Method of Manufacturing CNTs]

Next, an embodiment of my method of manufacturing is described. The case of implementing my method of manufacturing using the above-described embodiment of a CNT manufacturing apparatus is described below, yet in my method of manufacturing, a CNT manufacturing apparatus other than the above-described embodiment of a CNT manufacturing apparatus may be used.

In an embodiment of my method of manufacturing, the formation step to reduce the catalyst on the substrate, the growing step to grow the CNTs, and the cooling step to cool the substrate on which the CNTs have grown are performed sequentially in order to grow CNTs on the substrate. One characteristic of an embodiment of my method of manufacturing is the performance of a feedback control step to adjust the amount of catalyst activating material supplied in the growing step. Another characteristic of an embodiment of my method of manufacturing is the performance of a setting step to set the heating temperature at which at least one of the catalyst and the source gas is heated during the growing step.

These steps are described sequentially below.

(Formation Step)

The formation step is a step of causing an environment around the catalyst supported by the substrate to become a reducing gas environment and of heating the catalyst and/or the reducing gas. This step brings about at least one of the effects of reducing the catalyst, promoting atomization of the catalyst into fine particles, which is a state suitable for CNT growth, and improving the activity of the catalyst.

The formation step may be performed in the formation unit 102 provided in the CNT manufacturing apparatus 100.

<Substrate>

The substrate used in my method of manufacturing is a substrate provided with a base that supports, on a surface thereof, a catalyst for a CNT growth reaction.

—Base—

The base forming the substrate may be any member capable of supporting, on the surface thereof, a catalyst for a CNT growth reaction. The base can preferably maintain its shape even at a high temperature of 400° C. or above. Examples of materials include: metals such as iron, nickel, chromium, molybdenum, tungsten, titanium, aluminum, manganese, cobalt, copper, silver, gold, platinum, niobium, tantalum, lead, zinc, gallium, indium, germanium, and antimony; alloys and oxides containing any of these metals; nonmetals such as silicon, quartz, glass, mica, graphite, and diamond; and ceramic. Metals are preferable due to being lower in cost than silicon and ceramic. In particular, a Fe—Cr (iron-chromium) alloy, a Fe—Ni (iron-nickel) alloy, a Fe—Cr—Ni (iron-chromium-nickel) alloy, and the like are suitable.

—Shape of Substrate—

Examples of the form of the substrate include a flat plate, a thin film, a block, and the like. In particular, a flat plate allows for a large surface area for its volume and thus is advantageous for mass production of CNTs.

When using a substrate in the form of a flat plate, the thickness of the substrate is not limited and may, for example, be anywhere from a thin film of approximately several micrometers up to plate of approximately several centimeters. The thickness is preferably 0.05 mm or more to 3 mm or less. If the thickness of the substrate is 3 mm or less, the substrate can be sufficiently heated in the below-described growing step (CVD step), thereby both suppressing poor growth of CNTs and reducing the cost of the substrate. A thickness of 0.05 mm or more for the substrate allows for the suppression of a deformation of the substrate due to carburizing and is also advantageous for transfer and reuse of the substrate, since the substrate itself does not easily warp. In this disclosure, carburizing refers to permeation of the carbon component in the substrate.

The shape and size of a flat plate substrate are not limited. The substrate may be rectangular or square. The size of one side of the substrate is not limited, yet from the perspective of high-volume production of CNTs, a larger substrate is preferable. A large substrate may be suitably used with my method. For example, with my method, CNTs can be manufactured more uniformly on a substrate that measures 100 mm or more to 1000 mm or less on a side.

—Carburizing Prevention Layer—

The substrate may have a carburizing prevention layer formed on the front or back surface thereof, or on both. It is desirable that the substrate have a carburizing prevention layer formed on both the front and back surfaces thereof. The carburizing prevention layer is a protective layer for preventing the substrate from being carburized and therefore deformed in the carbon nanotube growing step.

The carburizing prevention layer is preferably formed from a metal or ceramic material. Ceramic material is highly effective in preventing carburizing and hence is particularly preferable. Examples of the metal include copper and aluminum. Examples of the ceramic material include oxides such as aluminum oxide, silicon oxide, zirconium oxide, magnesium oxide, titanium oxide, silica alumina, chromium oxide, boron oxide, calcium oxide, and zinc oxide; and nitrides such as aluminum nitride and silicon nitride. Among these, aluminum oxide and silicon oxide are preferable because they are highly effective in preventing carburizing.

—Catalyst—

A catalyst is supported on the surface of the substrate (on the surface of the carburizing prevention layer when the carburizing prevention layer is formed on the substrate). Examples of the catalyst include iron, nickel, cobalt, and molybdenum, and also a chloride or alloy of any of these. The catalyst may also be a complex of any of these with aluminum, alumina, titania, titanium nitride, or silicon oxide. The catalyst may also be in layer form. Specific examples of the catalyst include an iron-molybdenum thin film, an alumina-iron thin film, an alumina-cobalt thin film, an alumina-iron-molybdenum thin film, an aluminum-iron thin film, and an aluminum-iron-molybdenum thin film. The catalyst may be present in any amount within a range allowing for production of CNTs. For example, when using iron, the thickness of the iron layer is preferably 0.1 nm or more to 100 nm or less, more preferably 0.5 nm or more to 5 nm or less, and particularly preferably 0.8 nm or more to 2 nm or less.

Either a wet or dry process may be applied for formation of the catalyst on the surface of the substrate. Specifically, a sputtering evaporation method or a method for spreading/calcining a liquid obtained by dispersing fine metal particles in an appropriate solvent may be applied. Furthermore, it is possible to form the catalyst into any shape by concomitant use of patterning that applies well-known photolithography, nanoimprinting, or the like. Among these processes, a wet process is preferably used to form the catalyst on the substrate surface.

My manufacturing method makes it possible to control the shape of the aligned CNT aggregate freely via patterning of the catalyst formed on the substrate and the CNT growth time, so as to yield a thin film shape, cylindrical shape, prismatic shape, or any other complicated shape. In particular, in the shape of a thin film, the aligned CNT aggregate has an extremely small thickness (height) as compared to its length and width. However, the length and width can be freely controlled by the catalyst patterning, and the thickness can be freely controlled by the growth time for the CNTs that constitute the aligned CNT aggregate.

<Adjustment of Environment Around the Catalyst>

In the formation step, the environment around the catalyst supported by the substrate 111 is set to a reducing gas environment, for example by introducing the substrate 111 into the formation furnace 102a into which reducing gas has been supplied from the ejection section 102b.

The reducing gas may, for example, be hydrogen gas, ammonia, water vapor, or a gas that is a mixture thereof, or a gas that is a mixture of any of these with an inert gas such as helium gas, argon gas, nitrogen gas, or the like.

<Heating of the Catalyst and/or the Reducing Gas>

The catalyst and/or the reducing gas are heated in the formation step using, for example, the heaters 17 to 20. The temperature of the heated catalyst and/or reducing gas is preferably 400° C. or more to 1100° C. or less.

In the formation step, for example when using iron as the catalyst, a thin film of iron hydroxide or a thin film of iron oxide is formed on the substrate, and simultaneously or subsequently the thin film is reduced and atomized to form fine particles of iron. When the material for the carburizing prevention layer is alumina and the catalyst is iron, the iron catalyst layer is reduced and atomized, and many nanometer-sized fine particles of iron form on the alumina layer. The catalyst can thus be adjusted to be suitable for CNT production.

The duration of the formation step is preferably 3 min or more to 30 min or less, more preferably 3 min or more to 8 min or less. If the duration of the formation step is within this range, the fine particles of the catalyst are prevented from coarsening, and the formation of multi-walled carbon nanotubes in the subsequent growing step can be suppressed.

(Growing Step)

The growing step is a step to grow CNTs by supplying source gas and catalyst activating material onto the substrate that supports the catalyst, thereby setting the environment around the catalyst and the substrate to a source gas environment, and heating either or both of the catalyst and the source gas. In other words, in the growing step, for example CNTs are grown by a chemical vapor deposition (CVD) method on the substrate that has undergone the formation step. Via this step, CNTs grow on the substrate.

The growing step may be performed in the growth unit 10 provided in the CNT manufacturing apparatus 100.

<Supply of the Source Gas and the Catalyst Activating Material>

In the growing step in the growth unit 10, it suffices to grow CNTs on the substrate by a CVD method either after the CNT source gas and catalyst activating material are supplied to the growth furnace 11 into which the substrate 111 has been introduced, or while the source gas and catalyst activating material are being supplied. In the growing step, the CNT production efficiency and purity can be even further improved by causing the catalyst activating material to be present in the atmosphere in which the CNT growth reaction occurs.

<Heating of the Catalyst and/or the Source Gas>

At least one of the catalyst and the source gas is heated, yet it is more preferable to heat both. The heating temperature may be any temperature that allows for CNT growth, yet the temperature is preferably 400° C. or more to 1100° C. or less, and more preferably 600° C. or more to 900° C. or less. If the temperature is in the above range, the effects of the catalyst activating material can be expressed well, and the reaction between the catalyst activating material and the formed CNTs can be suppressed.

The pressure in the growing step is preferably $10^2$ Pa or more to $10^7$ Pa (100 atm) or less and more preferably $10^4$ Pa or more to $3 \times 10^5$ Pa (3 atm) or less.

<Source Gas>

The source gas may be any material that serves as raw material for CNT. For example, the source gas may be a gas that has a raw-material carbon source at the temperature at which the CNT growth reaction proceeds. Among these gases, hydrocarbons such as methane, ethane, ethylene, propane, butane, pentane, hexane, heptane, propylene, and acetylene are suitable as the source gas. Ethylene allows for efficient manufacturing of CNTs and is therefore particularly suitable. In addition, lower alcohols such as methanol, ethanol, and the like may be used. A mixture of these gases may also be used. Furthermore, the source gas may be diluted with an inert gas.

<Inert Gas>

It suffices for the inert gas to be a gas that is inert at the temperature at which the CNTs grow, that does not reduce the activity of the catalyst, and that does not react with the growing CNTs. Examples include helium, argon, nitrogen, neon, krypton, and a mixture of any of these. In particular, nitrogen, helium, argon, and mixtures thereof are suitable.

<Catalyst Activating Material>

As the catalyst activating material, a material that includes oxygen is preferable, and a material that does not inflict significant damage on the CNTs at the CNT growth temperature is even more preferable. Effective examples include water, oxygen, ozone, acidic gases, and nitrogen oxide; oxygen-containing compounds having a low carbon number, such as carbon monoxide and carbon dioxide; alcohols such as ethanol and methanol; ethers such as tetrahydrofuran; ketones such as acetone; aldehydes; esters; and mixtures thereof. Among these, water, oxygen, carbon dioxide, carbon monoxide, and ethers are preferable, with water and carbon dioxide being particularly suitable.

The amount of catalyst activating material added is not limited to a specific amount, yet in terms of concentration in the environment around the catalyst, when the catalyst activating material is water, the water may be added preferably in a range of 10 ppmV or more to 10000 ppmV or less, more preferably 50 ppmV or more to 1000 ppmV or less, and even more preferably 100 ppmV or more to 700 ppmV or less. When the catalyst activating material is carbon dioxide, the carbon dioxide is preferably added to 0.2 vol % to 70 vol %, more preferably 0.3 vol % to 50 vol %, and even more preferably 0.7 vol % to 20 vol %.

The mechanism by which the catalyst activating material functions is currently inferred to be as follows. In the process of growth of the CNTs, adhesion of by-products such as amorphous carbon and graphite to the catalyst causes deactivation of the catalyst, and the growth of the CNTs is therefore inhibited. However, the presence of the catalyst activating material causes amorphous carbon, graphite and the like to be oxidized into carbon monoxide, carbon dioxide, and the like, and therefore gasified. Hence, the catalyst activating material is believed to cleanse the catalyst and express the function of enhancing the activity and extending the active life of the catalyst (catalyst activating effect).

A compound that includes carbon and oxygen, such as an alcohol or carbon monoxide, may be used as the source gas or as the catalyst activating material. For example, when using these compounds in combination with a source gas that easily decomposes to become a carbon source (such as ethylene), it is inferred that the compounds act as a catalyst activating material. On the other hand, when using these compounds in combination with a highly active catalyst activating material such as water, it is inferred that the compounds act as a source gas. Furthermore, it is inferred that carbon monoxide and the like decompose into carbon atoms that become a carbon source for the CNT growth reaction and into oxygen atoms that act as a catalyst activating material by oxidizing and gasifying amorphous carbon, graphite, and the like.

<Environment of High Carbon Concentration>

The source gas atmosphere is preferably an environment of high carbon concentration. An environment of high carbon concentration refers to a growth atmosphere in which the ratio of the source gas to the total flow is approximately 2% to 20%. In particular, since the activity of the catalyst remarkably improves in the presence of the catalyst activating material, the catalyst is not deactivated even in an environment of high carbon concentration. CNT growth over an extended period of time is therefore possible, and the growth rate also remarkably improves. In an environment of high carbon concentration, a large amount of carbon contaminants adheres to the furnace wall and the like as compared to a conventional environment of low carbon concentration. With my method of manufacturing, however, the CNT growth environment can be maintained as an optimal environment, thereby preventing adhesion of carbon contaminants and allowing for efficient manufacturing of high-quality CNTs.

(Cooling Step)

The cooling step is a step, after the growing step, of cooling the CNTs, the catalyst, and the substrate in the presence of an inert gas. After the growing step, the CNTs, the catalyst, and the substrate are at a high temperature, and therefore may oxidize upon being placed in the presence of oxygen. This is prevented by cooling the CNTs, the catalyst, and the substrate in the cooling step in the presence of an inert gas. The temperature during the cooling step is 400° C. or less, more preferably 200° C. or less.

The cooling step may be performed in the cooling unit 10 provided in the CNT manufacturing apparatus 100.

(Feedback Control Step)

In an embodiment of my method of manufacturing, while growing CNTs on the substrate through the above-described formation step, growing step, and cooling step, a feedback control step is performed to control the supply amount of catalyst activating material supplied in the growing step.

In the feedback control step, based on the concentration of the gas component around the substrate during the above-described growing step, feedback control is performed on the supply amount of the catalyst activating material supplied in the growing step by adjusting the supply amount of the catalyst activating material.

The feedback control step may be performed using the ejection section 12, the section for measuring gas component concentration 16, and a control device (not illustrated) that are provided in the CNT manufacturing apparatus 100.

The reason for performing the feedback step in my method of manufacturing is as follows.

In the growing step, the activity and lifetime of the catalyst are dramatically increased by bringing the catalyst activating material into contact with the catalyst. As a result, catalyst activity is not lost even in an environment of high carbon concentration, and the manufacturing efficiency of CNTs increases dramatically.

When manufacturing CNTs in an environment of high carbon concentration, however, a large amount of carbon contaminants adheres to the growth furnace inner wall and the like. Corrosion, such as carburizing of the furnace wall in the growth furnace, also progresses. Due to the adhesion of large quantities of carbon contaminants or to the progression of corrosion on the furnace wall of the growth furnace, the gas composition around the substrate may end up deviating from optimal conditions for CNT growth, which may lead to a reduction in the amount of CNTs manufactured and a deterioration of CNT quality.

In the growth furnace, deviation from optimal conditions of the gas composition around the substrate is predicted to occur for the following two reasons.

1: Carbon contaminants and the catalyst activating material trigger a chemical reaction by which CO or $CO_2$ is produced, thereby changing the gas composition.

2: Due to carbon contaminants or furnace material corrosion, thermal conductivity on the furnace wall surface or in the furnace changes, and the amount of cracking of the source gas changes.

Therefore, in my method of manufacturing, the concentration of a gas component around the substrate during the growing step is monitored, and based on the concentration of the gas component, the supply amount of catalyst activating material supplied to the growth furnace is adjusted, thereby always maintaining the CNT growth environment around the substrate as an optimal growth environment.

I carefully examined how always to maintain the CNT growth environment around the substrate as an optimal growth environment. As a result, I discovered a correlation between the CNT yield and the concentration of hydrogen, methane, or ethane around the substrate for growing CNTs. I also newly discovered that by monitoring the concentration of a gas component around the substrate during CNT growth and performing feedback control on the supply amount of catalyst activating material based on the monitored concentration, the CNT growth environment around the substrate can be maintained as an optimal environment.

Therefore, in the feedback control step, the concentration of a gas component around the substrate 111 during the growing step is first measured in advance multiple times using the section for measuring gas component concentration 16. At this time, measurements may be made multiple times while the growing step is being performed for one substrate 111, or measurements may be made in the growing step for each of a plurality of different substrates 111.

The supply amount of catalyst activating material at the time of measurement is changed upon each measurement. The supply amount of catalyst activating material at the time of each measurement is measured with a measuring device provided in the catalyst activating material supply tube or the like. The measured values of the gas component concentration are each associated with the supply amount of catalyst activating material at the time of measurement and recorded in a database inside the device. Measurements of the gas component concentration may be made consecutively or intermittently.

When changing the source gas supply amount or temperature, the correlation between gas concentration and CNT growth breaks down. Therefore, in the feedback control step, control is performed by only changing the supply amount of catalyst activating material. Accordingly, upon changing the source gas supply amount or temperature during the growing step, the measurement of the gas component concentration, the recording of the measured value in association with the supply amount of catalyst activating material at the time of measurement, and extraction of the supply amount of catalyst activating material associated with the measured value are again performed, and feedback control is performed based on the newly extracted supply amount.

Like the phrases "near the substrate" or "surrounding the substrate", the phrase "around the substrate" refers to a range up to positions at a certain distance from the substrate, i.e. the space up to positions at a certain distance from the substrate. Specifically, "around the substrate" refers to a range such that the minimum distance to the substrate is 20 cm or less, preferably a range such that the minimum distance to the substrate is 10 cm or less, and more preferably a range such that the minimum distance to the substrate is 5 cm or less.

The gas components around the substrate during the growing step include hydrogen; hydrocarbons such as methane, ethane, ethylene, acetylene, propane, butane, pentane, hexane, heptane, and propylene; and water, carbon monoxide, carbon dioxide, or the like. In other words, in the growing step, the source gas that includes carbon atoms and hydrogen atoms, such as a hydrocarbon or alcohol, decomposes due to heating and contact with the catalyst, and while the carbon atoms form the CNTs, hydrogen gas is generated from the hydrogen atoms. A portion of the source gas also decomposes, recombines, and is reduced by the hydrogen atoms to generate hydrocarbon gas such as methane, ethane, and the like. For example, when using a hydrocarbon as the source gas, it is inferred that hydrogen, methane, and ethane are generated by the following reaction:

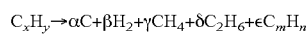
$C_xH_y \rightarrow \alpha C + \beta H_2 + \gamma CH_4 + \delta C_2H_6 + \epsilon C_mH_n$ where x, y, m, and n are each a positive integer.

In the feedback control step, based on my above-described discovery, the supply amount of catalyst activating material is subjected to feedback control based on the concentration of at least one component selected from the group consisting of hydrogen, methane, and ethane among the above-described gas components.

In other words, the supply amount of catalyst activating material supplied at the time of maximum concentration of the gas component among the plurality of measurements is extracted, the gas component being at least one of hydrogen, methane, and ethane. That is, based on data recorded in the database, among the plurality of measured values of the concentration of the gas component, the measured value representing the maximum concentration of at least one of hydrogen, methane, and ethane is selected, and the supply amount of catalyst activating material associated with this measured value is extracted from the database. The supply amount of the catalyst activating material supplied in the growing step is then adjusted to the extracted supply amount. When the source gas includes methane or ethane, however, the same type of gas as the source gas is preferably not used as the indicator for the feedback control.

In this way, the gas component concentration around the substrate can be maintained so that the concentration of at least one of the gas components of hydrogen, methane, and ethane is maximized. The concentrations of hydrogen, methane, and ethane around the substrate correlate with the CNT yield. Therefore, by controlling the supply amount of the catalyst activating material so that the concentration of at least one of the gas components of hydrogen, methane, and ethane is maximized, it becomes possible to maintain the CNT growth environment around the substrate as an optimal environment. As a result, the adhesion of carbon contaminants can be prevented, and high-quality carbon nanotubes can be manufactured efficiently.

In the feedback control step, among the plurality of measurements of the concentration of the gas component measured in advance, the supply amount of the catalyst activating material supplied at the time of maximum concentration of hydrogen is preferably extracted, and the supply amount of the catalyst activating material supplied in the growing step is preferably adjusted to the extracted supply amount. In other words, among the plurality of measured values of the concentration of the gas component, the measured value representing the maximum concentration of hydrogen is preferably selected, and the supply amount of catalyst activating material associated with this measured value is preferably extracted. More hydrogen than methane or ethane is detected around the substrate, thereby reducing detection error. Accordingly, by using the hydrogen concentration, the CNT growth environment can more reliably be optimized. With regards to methane and ethane, the hydrogen that increases during a CNT synthesis reaction may increase by reacting with other hydrocarbons in the gas phase. Therefore, by using the hydrogen concentration as an indicator, the environment around the substrate can more reliably be monitored.

The gas component around the substrate preferably includes ethylene. The gas component around the substrate may be caused to include ethylene by using ethylene as the source gas.

(Setting Step)

In an embodiment of my method of manufacturing, a setting step is performed before the above-described growing step and feedback control step.

In the setting step, before the growing step, the heating temperature to which at least one of the catalyst and the source gas is heated in the growing step is set based on the gas component concentration around the position at which the substrate is housed. Feedback control may be performed to adjust the heating temperature during the growing step based on the set heating temperature.

In the setting step, while the substrate 111 is not being housed in the growth furnace 11 of the growth unit 10, the CNT source gas and the catalyst activating material are supplied to the position at which the substrate 111 is to be housed, i.e. the area around the mounting surface 14. The source gas is then heated and pyrolyzed. In other words, the environment in the growth furnace 11 is made similar to the CNT growth environment.

In the section for measuring gas component concentration 16, the concentration of a gas component around the mounting surface 14 is measured. The concentration of a gas component around the mounting surface 14 correlates with the temperature around the mounting surface 14. The temperature around the mounting surface 14 at the time of growing desired CNTs is measured in advance and stored in a database, for example. Accordingly, based on this temperature, information on the concentration of a gas component around the mounting surface 14 at the time of growing desired CNTs can be obtained.

The heating temperature for heating at least one of the catalyst and the source gas is then set so that the measured concentration of the gas component matches the concentration for growing desired CNTs, the gas component being at least one of hydrogen, methane, and ethane. In this way, the environment around the substrate for growing CNTs can be set to an environment that yields desired CNTs. The "concentration for growing desired CNTs" can be determined in advance by performing an experiment.

Based on the value indicated by a thermocouple provided outside of the growth furnace, the temperature in the growth furnace is adjusted by controlling the setting for the heating temperature of the heater. In other words, the setting temperature of the heater and the temperature inside the growth furnace (actual temperature) do not necessarily match. Furthermore, upon operating the manufacturing apparatus for an extended period of time, the discrepancy between the setting temperature and the actual temperature changes to a variety of values. For example, upon operating the manufacturing apparatus for half a year to one year, the discrepancy changes by approximately several dozen degrees Celsius. Possible causes for such a change in the discrepancy include changing thermal conductivity due to carburizing of the furnace wall in the growth furnace, scale becoming loose on the inner wall of the growth furnace, and reduced thickness of the growth furnace itself.

Accordingly, during operation of the CNT manufacturing apparatus, the setting temperature normally needs to be optimized approximately every several months. Optimizing the setting temperature is an extremely cumbersome process, however, since to do so it has conventionally been necessary to measure the temperature profile in the growth furnace by inserting a thermocouple inside the growth furnace and displacing the thermocouple inside the growth furnace.

In the setting step, however, measurement of the concentration of a gas component in the CNT growth environment within the growth furnace is substituted for measurement of the temperature in the growth furnace. The concentration of a gas component in the CNT growth environment within the growth furnace correlates with the temperature in the growth furnace. Therefore, creating a temperature profile inside the growth furnace based on the concentration of the gas component is easier than measuring the temperature in the growth furnace directly.

In other words, in the setting step, the heating temperature is set based on the concentration of the source gas at the position at which the substrate is housed, and therefore the temperature of the CNT growth environment can be controlled more easily than by setting the heating temperature by directly measuring the temperature around the position at which the substrate is housed.

In the setting step, it suffices to set the heating temperature for heating at least one of the catalyst and the source gas based on the concentration of at least one gas component among hydrogen, methane, and ethane among the measurements of gas component concentration as measured by the section for measuring gas component concentration 16. The heating temperature is set by setting the temperature of the heaters 17 to 20. The concentration of the gas component that is the indicator for the heating temperature setting is preferably the concentration of hydrogen, for the same reason as in the feedback control step.

Like the phrase "near the position at which the substrate is housed" or "surrounding the position at which the substrate is housed", the phrase "around the position at which the substrate is housed" refers to a range up to positions at a certain distance from the position at which the substrate is housed, i.e. the space up to positions at a certain distance from the position at which the substrate is housed. Specifically, "around the position at which the substrate is housed" refers to a range such that the minimum distance to the position at which the substrate is housed is 20 cm or less, preferably a range such that the minimum distance to the position at which the substrate is housed is 10 cm or less, and more preferably a range such that the minimum distance to the position at which the substrate is housed is 5 cm or less.

The setting step may be performed every one to several months, for example, or when poor growth of CNTs occurs.

Preferred embodiments of my method have been described, yet my method is not limited to the above embodiments, and a variety of modifications and changes may be made within the scope of my method.

For example, by appropriately setting the reaction conditions, such as the source gas, heating temperature, and the like, single-walled or multi-walled CNTs may be selectively manufactured, and it is also possible to manufacture a mixture of both.

In the above embodiments, the catalyst has been described as being formed on the substrate surface by a film formation device separate from the manufacturing apparatus. The manufacturing apparatus may be structured, however, to include a catalyst film formation unit upstream from the formation unit 102, with the substrate passing through the catalyst film formation unit before entering the formation unit 102.

The categories contemplated herein include a CNT manufacturing apparatus used with my method of manufacturing, a control program and control device that implement the feedback control step and the setting step in this manufacturing apparatus, and a computer readable recording medium storing the program.

My method is not limited to the above embodiments, and a variety of modifications may be made within the scope of the claims. Other embodiments yielded by appropriately combining the technical means described in different embodiments above are also included in the technical scope of my method.

Examples

The following describes my method in detail with examples, yet my method is not limited to these examples. Note that below, "%" and "ppm" that represent amounts are mass standards, unless otherwise noted.

Assessment in my method is made in the following way.
(Specific Surface Area Measurement)

The specific surface area refers to the value obtained from a measured adsorption and desorption isotherm of liquid nitrogen at 77 K using the Brunauer, Emmett, Teller method. The specific surface area was measured by use of a BET specific surface area measuring apparatus (HM model-1210, manufactured by Mountech Co., Ltd.).
(G/D Ratio)

The G/D ratio was measured using a microscopic laser Raman system (Nicolet Almega XR, manufactured by Thermo Fisher Scientific Inc.). Specifically, CNTs near the center of the substrate and near the four corners of the substrate were peeled off, a laser was shone on the surface of CNTs where the CNTs were peeled off from the substrate, and the Raman spectrum was measured to calculate the G/D ratio.
(Preparation of Substrate)

A flat plate of Fe—Cr alloy SUS430 (produced by JFE Steel Corporation, Cr: 18%) measuring 500 mm wide by 500 mm tall and 0.3 mm thick was prepared as the substrate. Using a laser microscope, the surface roughness at several locations on the flat plate surface was measured, yielding an arithmetic average roughness Ra of approximately 0.063 μm.
(Catalyst Formation)

On the above-mentioned substrate, a catalyst was formed by the following method.

A coating agent for alumina film formation was produced by dissolving 1.9 g of aluminum tri-sec-butoxide into 100 mL (78 g) of 2-propanol and then adding and dissolving 0.9 g of triisopropanolamine as a stabilizer.

In an environment of 50% relative humidity, the coating agent for alumina film formation was applied onto the substrate by dip coating. The application was made by dipping the substrate into the coating agent for alumina film formation, leaving the substrate there for 20 sec, removing the substrate at a removal speed of 10 mm/sec, and air drying for 5 min. Next, the substrate was heated for 30 min in an air environment of 300° C. and then cooled to room temperature. An alumina film with a thickness of 40 nm was thus formed on the substrate.

Subsequently, a catalytic membrane coating agent was produced by dissolving 174 mg of iron acetate in 100 mL of 2-propanol and further dissolving 190 mg of triisopropanolamine as a stabilizer. At room temperature of 25° C. and in an environment of 50% relative humidity, the catalytic membrane coating agent was applied by dip coating onto the substrate on which the alumina film had been formed. The application was made by dipping the substrate into the catalytic membrane coating agent, leaving the substrate there for 20 sec, removing the substrate at a removal speed of 3 mm/sec, and air drying for 5 min. Next, the substrate was heated for 30 min in an air environment of 100° C. and subsequently cooled to room temperature. A catalyst formation film with a thickness of 3 nm was thus formed on the substrate with the alumina film therebetween.

Example 1

Using the above-described manufacturing apparatus 100, an aligned CNT aggregate was manufactured by continuously performing a manufacturing process including the formation step and the growing step on a substrate with a catalyst formed thereon, as described above. Water was used as the catalyst activating material.

Specifically, the substrate 111 with the catalyst formed thereon was mounted on the mesh belt 107a of the manufacturing apparatus, and while changing the transfer rate of the mesh belt 107a, an aligned CNT aggregate was manufactured on the substrate 111. The conditions for each section of the manufacturing apparatus 100 were set as listed in Table 1. In Table 1, an empty cell indicates that no setting was made.

TABLE 1

| | Gas flow (sLm) Composition | Setting temperature (° C.) | Processing time (min) | Exhaust amount (sLm) |
|---|---|---|---|---|
| Inlet purge section 101 | 300 $N_2$: 100% | | | |
| Exhaust section 103a | 100 $N_2$: 100% | | | 100 |
| Formation unit 102 | 140 $H_2$: 60% $N_2$: 40% | 822 | 28 | 140 |
| Exhaust section 103b | 125 $N_2$: 100% | | | 125 |
| Growth unit 10 | 150 $C_2H_4$: 10% $H_2O$: 55 ppm-440 ppm $N_2$: remainder | 817 | 11 | 150 |
| Exhaust section 103c | 100 $N_2$: 100% | | | 100 |
| Cooling unit 105 | 50 $N_2$: 100% | | 30 | |
| Outlet purge section 106 | 250 $N_2$: 100% | | | |

The amounts of gas ejected in the reducing gas ejection section 102b and the source gas ejection section 12 were set to suitable gas amounts for manufacturing an aligned CNT aggregate in proportion with the volume of the growth furnace 11. In order to reliably prevent mixing among gases between the formation furnace 102a and the growth furnace 11, the seal gas amount and the exhaust amount were set to be the highest for the exhaust section 103b among the three exhaust sections 103a to 103c of the three gas mixing prevention means 103.

In the growing step, the supply amount of the catalyst activating material was adjusted by feedback control. In the section for measuring gas component concentration 16, approximately 1 sLm of gas around the substrate 111 during manufacturing of the aligned CNT aggregate was suctioned, and the concentrations of hydrogen, methane, and ethane were each monitored.

Figure 5:
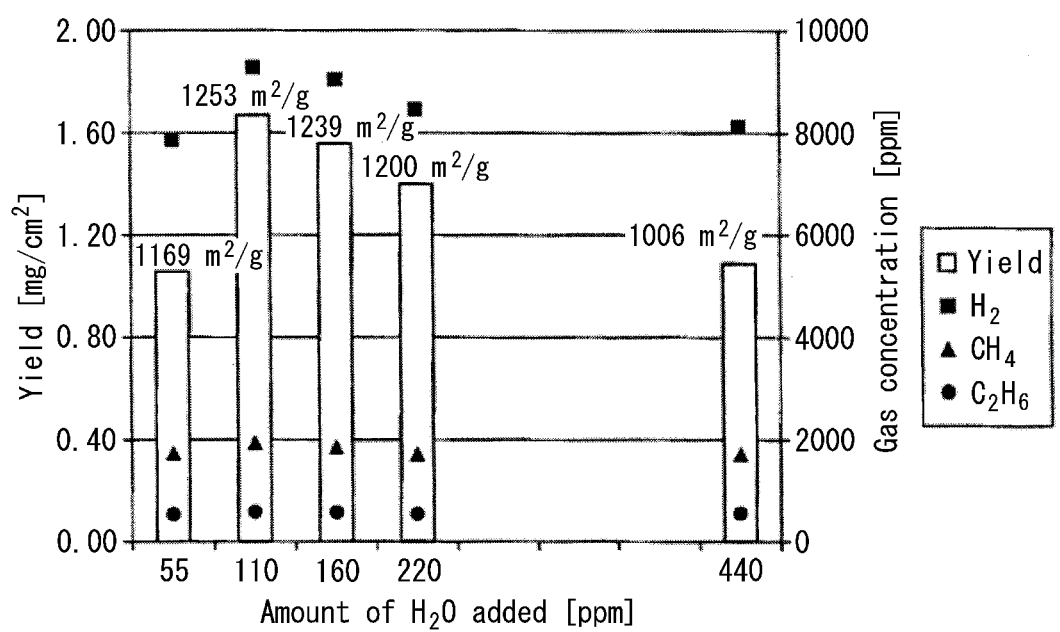
FIG. 5 illustrates the relationship between the added amount of water as the catalyst activating material and the gas concentration.
Figure 6:
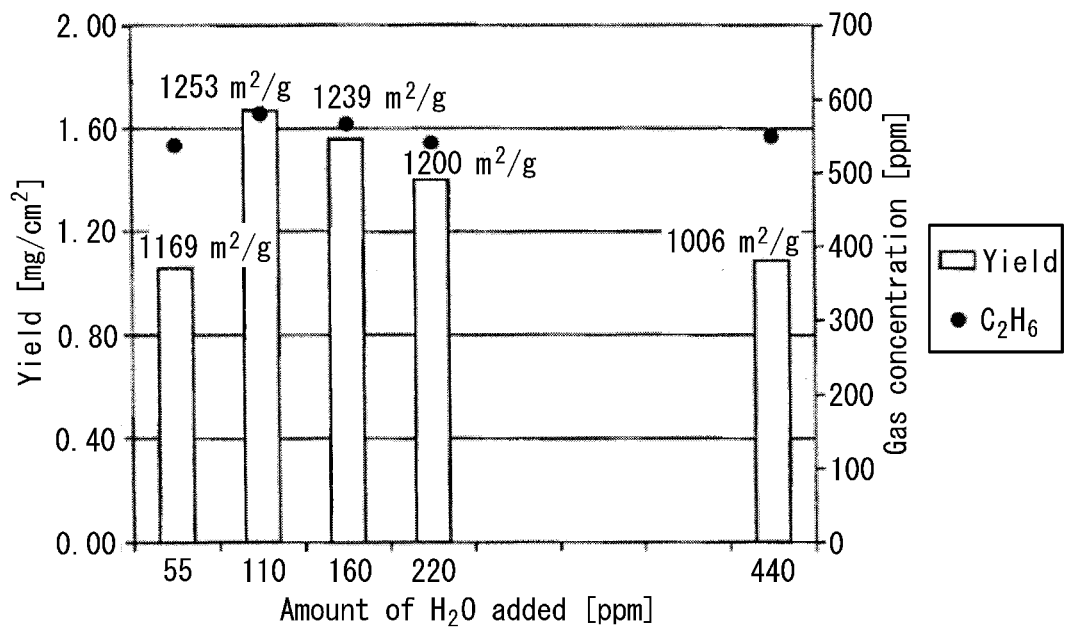
FIG. 6 illustrates a portion of the results when changing the size of the scale that indicates the gas concentration in FIG. 5.

FIGS. 5 and 6 show the results of monitoring. FIG. 5 is a graph illustrating the relationship between the added amount of water as the catalyst activating material and the gas concentration, and FIG. 6 is a graph illustrating a portion of the results when changing the size of the scale that indicates the gas concentration in FIG. 5. In FIGS. 5 and 6, the numerical values at the top of each bar indicate the specific surface area of the resulting CNTs.

The added amount of the catalyst activating material at the time of maximum concentration of at least one of hydrogen, methane, and ethane was extracted based on FIGS. 5 and 6, and the amount of water, which was the catalyst activating material supplied in the growing step, was adjusted to match this added amount. As illustrated in FIGS. 5 and 6, by measuring the gas component concentrations a plurality of times at predetermined intervals and adjusting the supply amount of the catalyst activating material, it was possible to maintain the yield (mass per unit area of the substrate) and quality of CNTs at good levels even during continuous manufacturing over an extended period of time.

Example 2

As in Example 1, the manufacturing apparatus 100 was used to manufacture an aligned CNT aggregate, using carbon dioxide as the catalyst activating material. The catalyst formation conditions and the conditions for each section of the manufacturing apparatus 100 were similar to those of Example 1. As in Example 1, in the growing step, the supply amount of carbon dioxide, which was the catalyst activating material, was adjusted by a feedback control step. In the section for measuring gas component concentration 16, approximately 1 sLm of gas around the substrate 111 during manufacturing of the aligned CNT aggregate was suctioned, and the concentrations of hydrogen, methane, and ethane were each monitored.

Figure 7:
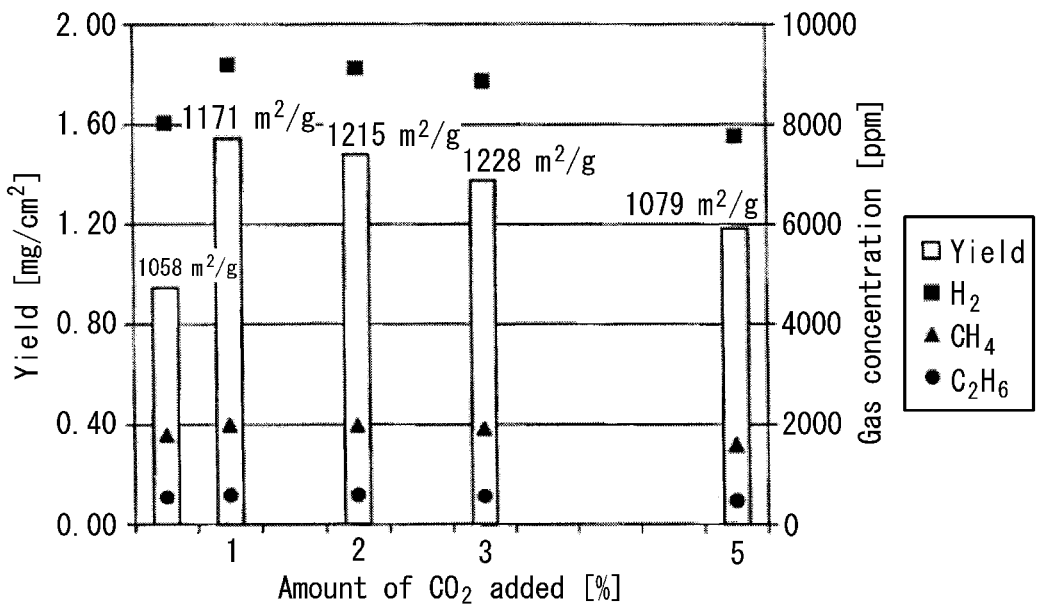
FIG. 7 illustrates the relationship between the added amount of carbon dioxide as the catalyst activating material and the gas concentration.
Figure 8:
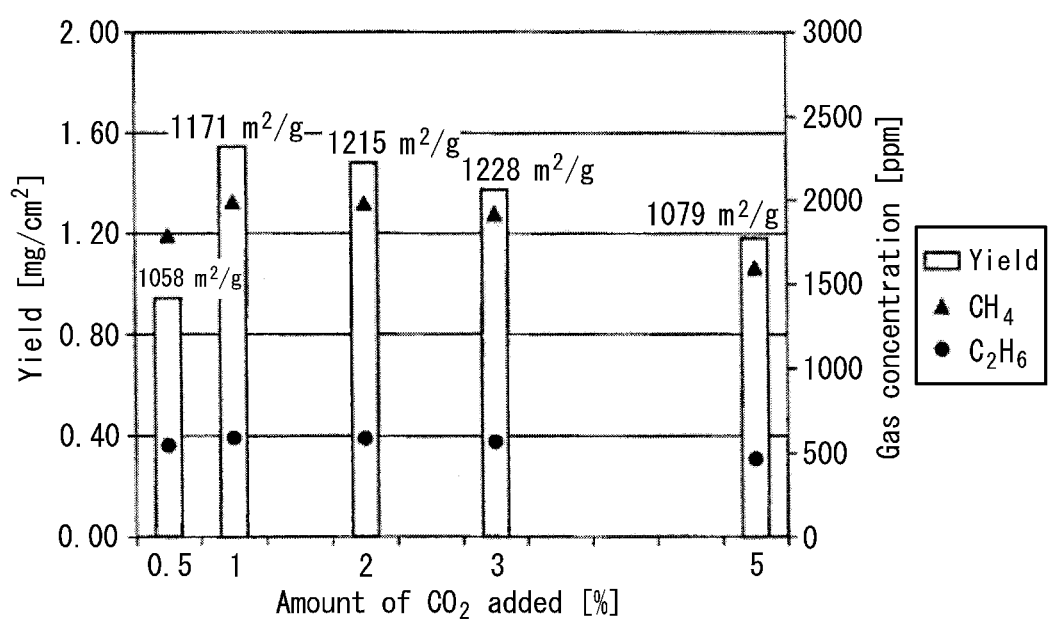
FIG. 8 illustrates a portion of the results when changing the size of the scale that indicates the gas concentration in FIG. 7.

FIGS. 7 and 8 show the results of monitoring. FIG. 7 is a graph illustrating the relationship between the added amount of carbon dioxide as the catalyst activating material and the gas concentration, and FIG. 8 is a graph illustrating a portion of the results when changing the size of the scale that indicates the gas concentration in FIG. 7. In FIGS. 7 and 8, the numerical values at the top of each bar indicate the specific surface area of the resulting CNTs.

The added amount of the catalyst activating material at the time of maximum concentration of at least one of hydrogen, methane, and ethane was extracted based on FIGS. 7 and 8, and the amount of carbon dioxide, which was the catalyst activating material supplied in the growing step, was adjusted to match this added amount. As illustrated in FIGS. 7 and 8, by measuring the gas component concentrations a plurality of times at predetermined intervals and adjusting the supply amount of the catalyst activating material, it was possible to maintain the yield (mass per unit area of the substrate) and quality of CNTs at good levels even during continuous manufacturing over an extended period of time.

Other characteristics of the CNTs manufactured in Examples 1 and 2 were a density of 0.025 $g/cm^3$ to 0.06 $g/cm^3$, a mean outside diameter of 2.8 nm to 3.0 nm (half width: 2 nm), a carbon purity of 99.9%, a Herman's orientation factor of 0.7, and a G/D ratio by Raman spectrum measurement of 4 to 6.

Example 3

Figure 10:
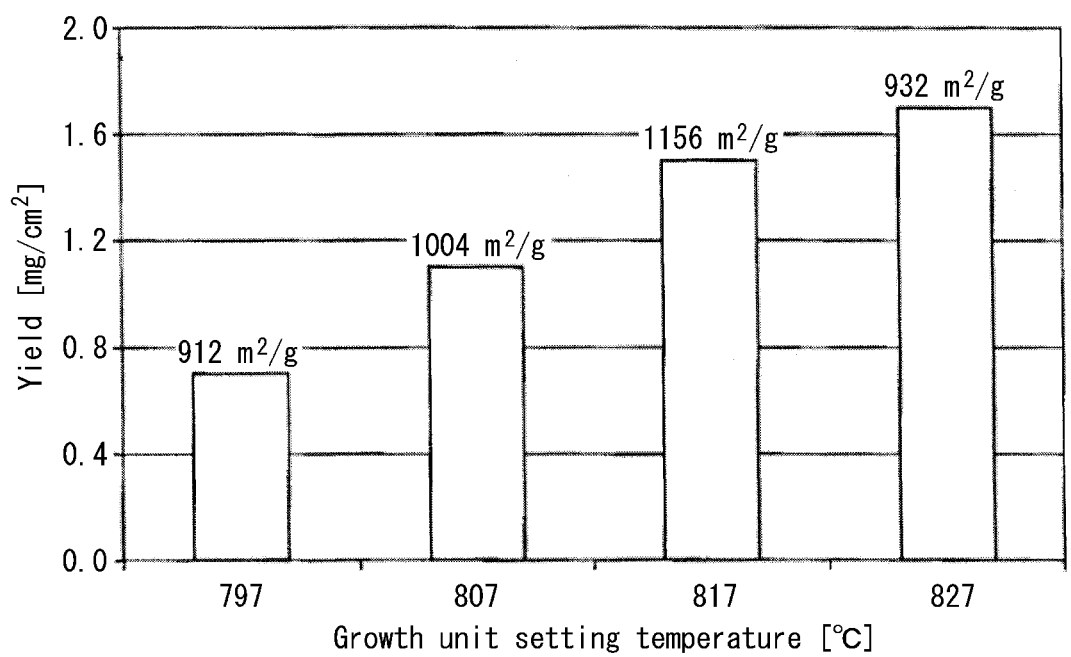
FIG. 10 illustrates the relationship of the setting temperature of the growth unit to the CNT yield and specific surface area.

Other than changing the setting temperature of the growth unit 10 before the growing step of Example 1, CNTs were manufactured in a similar way as in Example 1, and the relationship illustrated in FIG. 10 was obtained as the correlation between the setting temperature of the growth unit 10 and the yield and specific surface area of the resulting CNTs. In this example, from the perspective of obtaining a high yield of CNTs with a large specific surface area, 817° C. was chosen as the optimal setting temperature for the growth unit 10.

Figure 9:
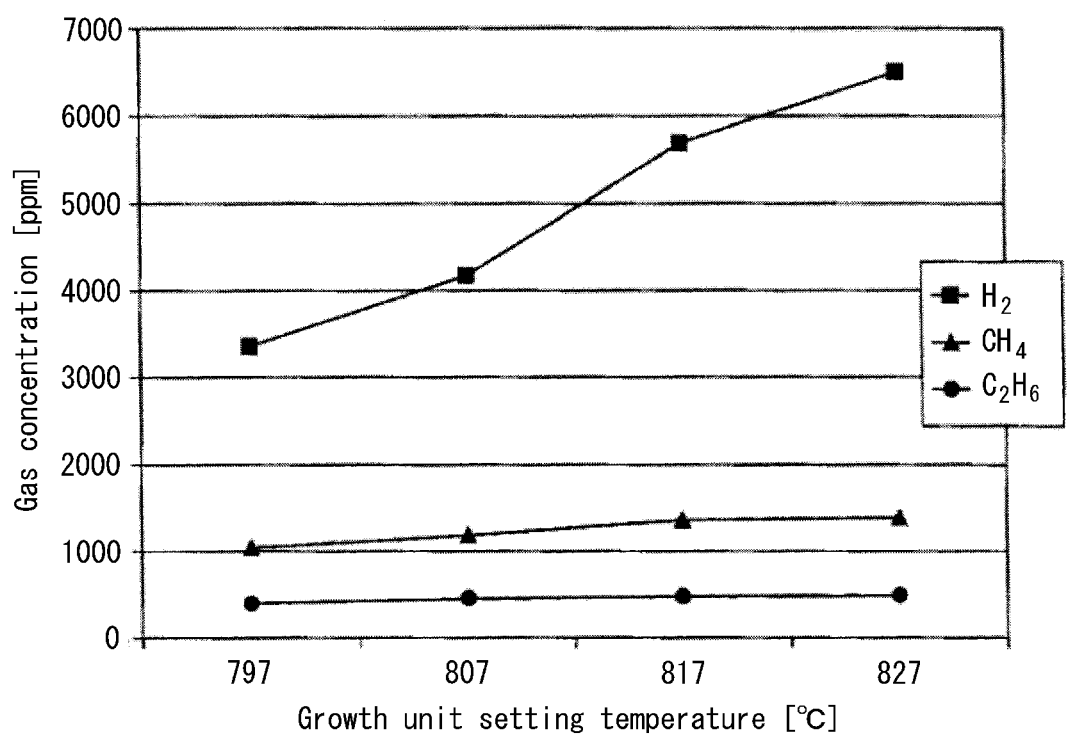
FIG. 9 illustrates the relationship between the setting temperature of the growth unit and gas concentration.

Next, in the same way as above, except for not introducing the substrate 111, gas including the source gas and the catalyst activating material was supplied around the position at which the substrate is housed while changing the setting temperature of the growth unit 10, and the gas concentrations were measured with the section for measuring gas component concentration 16. FIG. 9 is a graph illustrating the relationship between the setting temperature of the growth unit 10 and the gas concentrations in the section for measuring gas component concentration 16. From FIG. 9, it is clear that the concentrations of hydrogen, methane, and ethane at a setting temperature of 817° C. for the growth unit 10 were respectively hydrogen: 5700 ppmV, methane: 1300 ppmV, and ethane: 470 ppmV.

The temperature in the growth furnace 11 is adjusted by the setting temperature of the growth unit 10. The characteristics of the CNTs yielded in the growing step are influenced by the temperature in the growth furnace 11. In a state when carbon contaminants are not adhered inside the growth furnace, the setting temperature of the growth unit 10 and the actual temperature in the growth furnace 11 do not diverge greatly. Therefore, it suffices to set the setting temperature of the growth unit 10 to the temperature at which desired CNTs are obtained based on the graph illustrating the relationship between the setting temperature of the growth unit 10 and the yield and specific surface area of CNTs, as illustrated in FIG. 10. Upon operating the apparatus for an extended period of time, however, carbon contaminants occur in the growth furnace, and the temperature in the growth furnace 11 ends up diverging greatly from the setting temperature of the growth unit 10.

In this example, periodically during continuous manufacturing of aligned CNT aggregates, as described above, the gas concentration was measured in the same way as in Example 1, without introducing the substrate 111, and the setting temperature of the growth unit 10 was adjusted so that the concentrations of hydrogen, methane, and ethane approached the above-listed suitable concentrations (hydrogen: 5700 ppmV, methane: 1300 ppmV, ethane: 470 ppmV).

As a result, it was possible to maintain the yield (mass per unit area of the substrate) and quality of CNTs at good levels even during continuous manufacturing over an extended period of time.

INDUSTRIAL APPLICABILITY

The CNTs obtained with my method of manufacturing can be suitably used in fields such as electronic device materials, optical device materials, conducting materials, and the like.

REFERENCE SIGNS LIST

10 Growth unit
11 Growth furnace
12 Ejection section
12a Nozzle
13 Exhaust section
13a Exhaust vent
14 Mounting surface
15 Exhaust vent
100 CNT manufacturing apparatus (carbon nanotube manufacturing apparatus)
111 Substrate

The invention claimed is:

1. A method of manufacturing carbon nanotubes, the method comprising the steps of:
   growing carbon nanotubes on a substrate that supports a catalyst on a surface thereof by supplying a carbon nanotube source gas and a catalyst activating material to the catalyst and heating at least one of the catalyst and the source gas; and
   performing feedback control by
      making a plurality of measurements of a concentration of a gas component around the substrate during the growing step, the gas component comprising hydrogen, methane, and ethane;
      selecting a measurement among the plurality of measurements that represents the maximum concentration of at least one selected from the group consisting of hydrogen, methane, and ethane;
      extracting a supply amount of the catalyst activating material associated with the selected measurement; and
      adjusting a supply amount of the catalyst activating material supplied in the growing step to the extracted supply amount.

2. The method of claim 1, wherein the performing feedback control step comprises selecting the measurement among the plurality of measurements that represents the maximum concentration of hydrogen.

3. The method of claim 1, wherein the gas component around the substrate further comprises ethylene.

4. The method of claim 1, further comprising the step of:
   setting, before the growing step, a heating temperature to which at least one of the catalyst and the source gas is heated in the growing step, wherein
   the setting step comprises:
      supplying a carbon nanotube source gas and a catalyst activating material around a position at which the substrate is housed and heating the source gas;
      measuring a concentration of a gas component around the position at which the substrate is housed, the gas component comprising hydrogen, methane, and ethane; and
      setting the heating temperature so that the measured concentration of at least one selected from the group consisting of hydrogen, methane, and ethane matches a concentration for growing desired carbon nanotubes.

* * * * *